(12) United States Patent
Hirota

(10) Patent No.: US 8,520,103 B2
(45) Date of Patent: *Aug. 27, 2013

(54) SOLID-STATE IMAGING DEVICE, SIGNAL PROCESSING METHOD THEREOF AND IMAGE CAPTURING APPARATUS

(71) Applicant: Sony Corporation, Tokyo (JP)

(72) Inventor: Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/665,608

(22) Filed: Oct. 31, 2012

(65) Prior Publication Data

US 2013/0057735 A1    Mar. 7, 2013

Related U.S. Application Data

(63) Continuation of application No. 12/728,499, filed on Mar. 22, 2010, now Pat. No. 8,310,573.

(30) Foreign Application Priority Data

Mar. 31, 2009    (JP) .................................. 2009-084144

(51) Int. Cl.
*H04N 3/14*        (2006.01)
*H04N 5/335*       (2011.01)
*H04N 9/04*        (2006.01)
*H01L 27/146*      (2006.01)

(52) U.S. Cl.
USPC ............................ 348/275; 348/273; 257/435

(58) Field of Classification Search
USPC .................. 348/273–280; 257/432, 435, 291; 250/208.1

See application file for complete search history.

(56) References Cited

U.S. PATENT DOCUMENTS

| | | | |
|---|---|---|---|
| 7,554,067 B2 | 6/2009 | Zarnowski et al. | |
| 7,750,946 B2 | 7/2010 | Kosakai | |
| 7,924,319 B2 | 4/2011 | Kosakai | |
| 8,139,129 B2 | 3/2012 | Kozlowski | |

FOREIGN PATENT DOCUMENTS

JP    2007-235888    9/2007

*Primary Examiner* — Kelly L Jerabek
(74) *Attorney, Agent, or Firm* — Dentons US LLP

(57) ABSTRACT

A solid-state imaging device including a plurality of pixels and a color array filter. The color array filter is provided with filters over the plurality of pixels. The color array filter has a spatial sampling point (x, y) is approximately arranged in at least one of (x=3*(2n−1+oe)+1±2 and y=3m−2) and (x=3*(2n−1+oe)+1 and y=3m−2±2) is satisfied, where n and m are integers, and oe has a value of 0 when m is an odd number and 1 when m is an even number.

10 Claims, 30 Drawing Sheets

: R (RED)   : G (GREEN)   : B (BLUE)

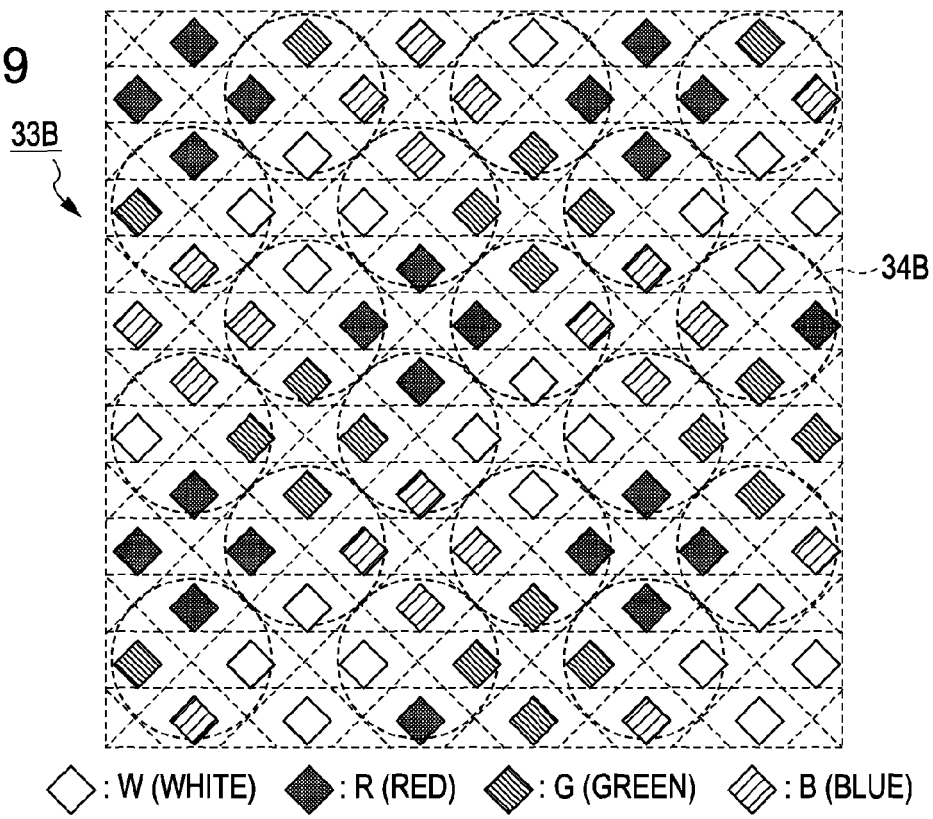

◇ : W (WHITE)  ◆ : R (RED)  ▦ : G (GREEN)  ▨ : B (BLUE)

SPATIAL SAMPLING POINT
x, y = 3*(2n−1+oe)+1±2, 3m−2    WHEN m IS ODD NUMBER oe = 0,
        3*(2n−1+oe)+1, 3m−2±2     WHEN m IS EVEN NUMBER oe = 1,
                                    n, m = INTEGER

| oe | m | n=1 x | y | n=1 x | y | n=2 x | y | n=2 x | y | n=3 x | y | n=3 x | y | n=4 x | y | n=4 x | y |
|---|---|---|---|---|---|---|---|---|---|---|---|---|---|---|---|---|---|
| 0 | 1 | 2 | 1 | 4 | −1 | 8 | 1 | 10 | −1 | 14 | 1 | 16 | −1 | 20 | 1 | 22 | −1 |
| 0 | 1 | 6 | 1 | 4 | 3 | 12 | 1 | 10 | 3 | 18 | 1 | 16 | 3 | 24 | 1 | 22 | 3 |
| 1 | 2 | 5 | 4 | 7 | 2 | 11 | 4 | 13 | 2 | 17 | 4 | 19 | 2 | 23 | 4 | 25 | 2 |
| 1 | 2 | 9 | 4 | 7 | 6 | 15 | 4 | 13 | 6 | 21 | 4 | 19 | 6 | 27 | 4 | 25 | 6 |
| 0 | 3 | 2 | 7 | 4 | 5 | 8 | 7 | 10 | 5 | 14 | 7 | 16 | 5 | 20 | 7 | 22 | 5 |
| 0 | 3 | 6 | 7 | 4 | 9 | 12 | 7 | 10 | 9 | 18 | 7 | 16 | 9 | 24 | 7 | 22 | 9 |
| 1 | 4 | 5 | 10 | 7 | 8 | 11 | 10 | 13 | 8 | 17 | 10 | 19 | 8 | 23 | 10 | 25 | 8 |
| 1 | 4 | 9 | 10 | 7 | 12 | 15 | 10 | 13 | 12 | 21 | 10 | 19 | 12 | 27 | 10 | 25 | 12 |
| 0 | 5 | 2 | 13 | 4 | 11 | 8 | 13 | 10 | 11 | 14 | 13 | 16 | 11 | 20 | 13 | 22 | 11 |
| 0 | 5 | 6 | 13 | 4 | 15 | 12 | 13 | 10 | 15 | 18 | 13 | 16 | 15 | 24 | 13 | 22 | 15 |
|   |   | LEFT | UP |   |   |   |   |   |   |   |   |   |   |   |   |   |   |
|   |   | RIGHT | DOWN |   |   |   |   |   |   |   |   |   |   |   |   |   |   |

OUTPUT SAMPLING POINT
x, y = 2n, 2m+1    n, m = INTEGER

| m \ n | 0 | 1 | 2 | 3 | 4 | 5 |
|---|---|---|---|---|---|---|
| 0 | 0 1 | 2 1 | 4 1 | 6 1 | 8 1 | 10 1 |
| 1 | 0 3 | 2 3 | 4 3 | 6 3 | 8 3 | 10 3 |
| 2 | 0 5 | 2 5 | 4 5 | 6 5 | 8 5 | 10 5 |
| 3 | 0 7 | 2 7 | 4 7 | 6 7 | 8 7 | 10 7 |
| 4 | 0 9 | 2 9 | 4 9 | 6 9 | 8 9 | 10 9 |
| 5 | 0 11 | 2 11 | 4 11 | 6 11 | 8 11 | 10 11 |
| 6 | 0 13 | 2 13 | 4 13 | 6 13 | 8 13 | 10 13 |
| 7 | 0 15 | 2 15 | 4 15 | 6 15 | 8 15 | 10 15 |
| 8 | 0 17 | 2 17 | 4 17 | 6 17 | 8 17 | 10 17 |
| 9 | 0 19 | 2 19 | 4 19 | 6 19 | 8 19 | 10 19 |
| 10 | 0 21 | 2 21 | 4 21 | 6 21 | 8 21 | 10 21 |

◇ : W (WHITE)  ◆ : R (RED)  ▨ : G (GREEN)  ◈ : B (BLUE)

THE NUMBER OF PIXELS = H5 × V10 = 50 PIXELS

SPATIAL SAMPLING POINT
x, y = 2*(2n−1+oe)±1, 2m−1      WHEN m IS ODD NUMBER oe == 0,
       2*(2n−1+oe), 2m−1±1      WHEN m IS EVEN NUMBER oe = 1,
                                 n, m = INTEGER

FIG. 21
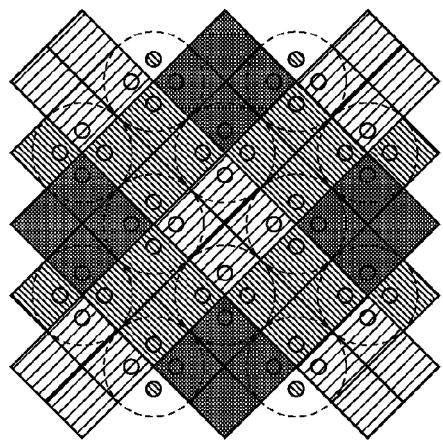
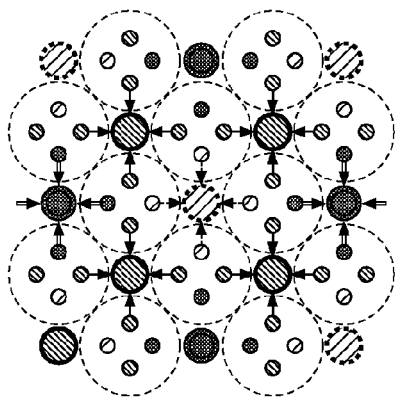
■ : R (RED)
▨ : G (GREEN)
▨ : B (BLUE)
● : R (RED)
◉ : G (GREEN)
◌ : B (BLUE)
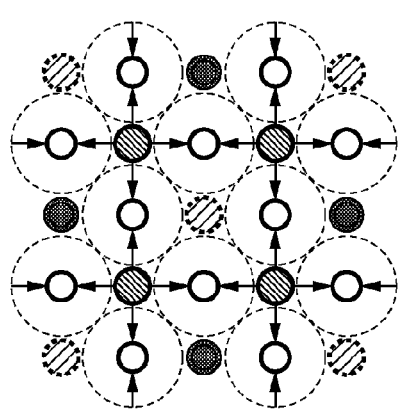
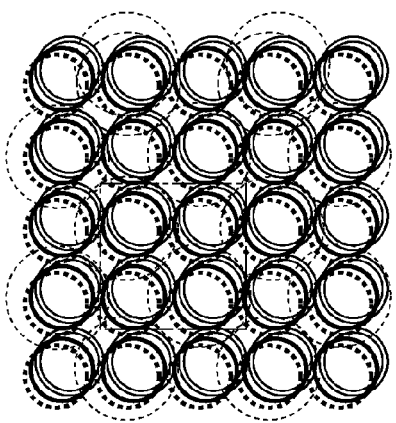
◎ : R (RED)
○ : G (GREEN)
⃝ : B (BLUE)

OVAL SHAPE

OCTAGONAL SHAPE

HEXAGONAL SHAPE

◇ : W (WHITE)  ◆ : R (RED)  ◇ : G (GREEN)  ◇ : B (BLUE)

● ◆ : R (RED)   ⊘ ▦ : G (GREEN)   ⊖ ◇ : B (BLUE)

WHEN INDEPENDENT READING IS PERFORMED
STANDARD RECORDING PIXEL = 9/8 = 1.125 TIMES
WHEN PIXEL IS SHIFTED = 36/8 = 4.5 TIMES

● ◆ : R (RED)   ◎ ◈ : G (GREEN)   ⊘ ◇ : B (BLUE)

◇ : W HIGH SENSITIVITY  ◆ : R HIGH SENSITIVITY  ◈ : G HIGH SENSITIVITY  ◇ : B HIGH SENSITIVITY
◇ : W LOW SENSITIVITY  ◈ : R LOW SENSITIVITY  ◇ : G LOW SENSITIVITY  ◇ : B LOW SENSITIVITY

- ◆ : R HIGH SENSITIVITY
- ◈ : R LOW SENSITIVITY
- ◊ : G HIGH SENSITIVITY
- ◇ : G LOW SENSITIVITY
- ◈ : B HIGH SENSITIVITY
- ◇ : B LOW SENSITIVITY

WHEN INDEPENDENT
READING IS PERFORMED

EFFECTIVE PIXEL
= 8/8 PIXELS

RECORDING PIXEL
= 9/8 = 1.125 PIXELS

☐ : W   ■ : R   ▧ : G   ▦ : B

◇ : W HIGH SENSITIVITY   ◆ : R HIGH SENSITIVITY   ◈ : G HIGH SENSITIVITY   ◇ : B HIGH SENSITIVITY
◇ : W LOW SENSITIVITY   ◈ : R LOW SENSITIVITY   ◇ : G LOW SENSITIVITY   ◇ : B LOW SENSITIVITY

WHEN INDEPENDENT
READING IS PERFORMED

EFFECTIVE PIXEL
= 8/8 PIXELS

RECORDING PIXEL
= 9/8 = 1.125 PIXELS

WHEN ADDITION IS PERFORMED

EFFECTIVE PIXEL = 5/16 PIXELS

RECORDING PIXEL = 4/8 = 0.5 PIXELS

▯ : W    ▮ : R    ▨ : G    ▧ : B

SOLID-STATE IMAGING DEVICE, SIGNAL PROCESSING METHOD THEREOF AND IMAGE CAPTURING APPARATUS

RELATED APPLICATION DATA

This application is a continuation of U.S. patent application Ser. No. 12/728,499, filed Mar. 22, 2010, the entirety of which is incorporated herein by reference to the extent permitted by law. This application claims the benefit of priority to Japanese Patent Application No. JP 2009-084144 filed in the Japanese Patent Office on Mar. 32, 1009, the entirely of which is incorporated herein by reference to the extent permitted by law.

BACKGROUND OF THE INVENTION

1. Technical Field

The present invention relates to a solid-state imaging device, a signal processing method thereof and an image capturing apparatus.

2. Description of the Related Art

There is disclosed a solid-state imaging device in which in order to improve sensitivity of luminance while suppressing degradation of color resolution, a color filter array arranged on pixels has color coding of pixels arranged in a checkered pattern array. In the color coding of the checkered pattern array, pixels adjacent to each other in the upper/lower and right/left directions have the same color (for example, refer to Japanese Unexamined Patent Application Publication No. 2007-235888).

In the color coding, a spatial sampling point (x, y) (i.e., an optical pixel center) is expressed by an equation below. That is, $x=2*(2n-1+oe)\pm1$ and $y=2m-1$ (n and m are an integer, oe has a value of 0 when m is an odd number and 1 when m is an even number)) and $x=2*(2n-1+oe)$ and $y=2m-1\pm1$ (n and m are an integer, oe has a value of 0 when m is an odd number and 1 when m is an even number).

In general, pixel signals corresponding to color coding of a color filter array are output from a solid-state imaging device as raw data. Then, demosaic processing is performed on the raw data output from the solid-state imaging device. In the demosaic processing, each pixel having single color information is supplied with color information collected from signals of adjacent pixels thereto, so that necessary color information is added, thereby creating a full color image.

SUMMARY OF THE INVENTION

In the related art, when a checkered pattern array is converted to a square array through the demosaic processing, pixel information on the center of adjacent four pixels is generated through the demosaic processing using the pixels, and the number of pixels becomes twice the number of actual pixels. At that time, a spatial sampling point (x, y) when the pixel information is stored in an image memory is defined by (n, m). Thus, since an image memory having a memory capacity larger than a memory capacity corresponding to the number of actual pixels is necessary, the cost for the entire system including the image memory may be increased.

In view of the above issues, it is desirable to provide a solid-state imaging device capable of reducing the system cost by decreasing the capacity of an image memory necessary when improving sensitivity of luminance while suppressing degradation of color resolution, a signal processing method thereof and an image capturing apparatus including the solid-state imaging device.

According to an embodiment of the invention, there is provided a solid-state imaging device including: a color filter array based on a checkered pattern array and in which two pixels adjacent to each other in at least one of upper/lower and right/left directions have the same color. The color filter array is a color filter array in which a spatial sampling point (x, y) is approximately arranged in at least one of $(x=3*(2n-1+oe)+1\pm2$ and $y=3m-2$ (n and m are an integer, oe has a value of 0 when m is an odd number and 1 when m is an even number)) and $(x=3*(2n-1+oe)+1$ and $y=3m-2\pm2$ (n and m denote an integer, and oe has a value of 0 when m is an odd number and 1 when m is an even number)).

The above equations represent a spatial pixel array (checkered-pattern-based color filter array) obtained by inclining a checkered pattern array by 45°. Further, in units of n and m having a specific value, two pixels adjacent to each other in at least one of the upper/lower and right/left directions, preferably, four adjacent pixels in the upper/lower and right/left directions have the same color. Accordingly, the checkered-pattern-based color filter array is used and further a pixel array recorded in an image memory after demosaic processing can be expressed by (x=2n, y=2m+1). The fact that the recorded pixel array is expressed by (x=2n, y=2m+1) means that the number of pixels recorded in the image memory is almost equal to the number of actual pixels of a pixel array unit including pixels two-dimensionally arranged in a matrix form.

According to an embodiment of the invention, the number of pixels recorded in the image memory can be almost equal to the number of actual pixels of the pixel array unit, so that the capacity of the image memory can be prevented from being unnecessarily increased. Further, when improving sensitivity of luminance while suppressing degradation of color resolution, a memory capacity necessary for the demosaic processing is reduced, so that the cost for the entire system can be reduced.

BRIEF DESCRIPTION OF THE DRAWINGS

FIG. 7 is a diagram illustrating a pixel array after demosaic processing for a square array is performed when focusing on the resolution of green which serves as a main component of a luminance signal;

FIG. 8 is a diagram illustrating a pixel array after demosaic processing for a square array is performed when focusing on the resolution of red and blue which serve as a main component of a color signal;

FIG. 9 is a diagram illustrating color coding of a color filter array according to a second embodiment of the invention;

FIG. 10 is a diagram illustrating a state in which optical centers are arranged in an x-y space with respect to color coding of a color filter array according to the second embodiment;

FIG. 11 is a diagram illustrating a pixel array after demosaic processing for a square array is performed when focusing on the resolution of white and green which serve as a main component of a luminance signal;

FIG. 12 is a diagram illustrating a pixel array after demosaic processing is performed by defining Gw as (W−R−B);

FIGS. 19A and 19B are diagrams illustrating an output sampling point in the case of color coding according to the third embodiment;

FIG. 21 is a diagram illustrating the configuration in which signals of adjacent four pixels having the same color are added in color coding according to the first embodiment;

DESCRIPTION OF THE PREFERRED EMBODIMENTS

Hereinafter, preferred embodiments of the invention (hereinafter, referred to as embodiments) will be described in detail with reference to the accompanying drawings. Furthermore, the description will be given in order of the following items.

1. Solid-state Imaging Device to which the Invention is applied (example of CMOS image sensor)

2. Scope of Main Features of the Invention

3. First Embodiment (example in which an RGB Bayer array in units of four pixels having the same color is rotated by 45°)

4. Second Embodiment (example in which a WRGB checkered pattern array in units of four pixels having the same color is rotated by 45°)

5. Third Embodiment (example in which a W checkered pattern array in units of four pixels having the same color is rotated by 45°)

6. Modification of Pixel Array

7. Application (example of an image capturing apparatus)

<1. Solid-state Imaging Device to Which the Invention is Applied>

[System Configuration]

Figure 1:
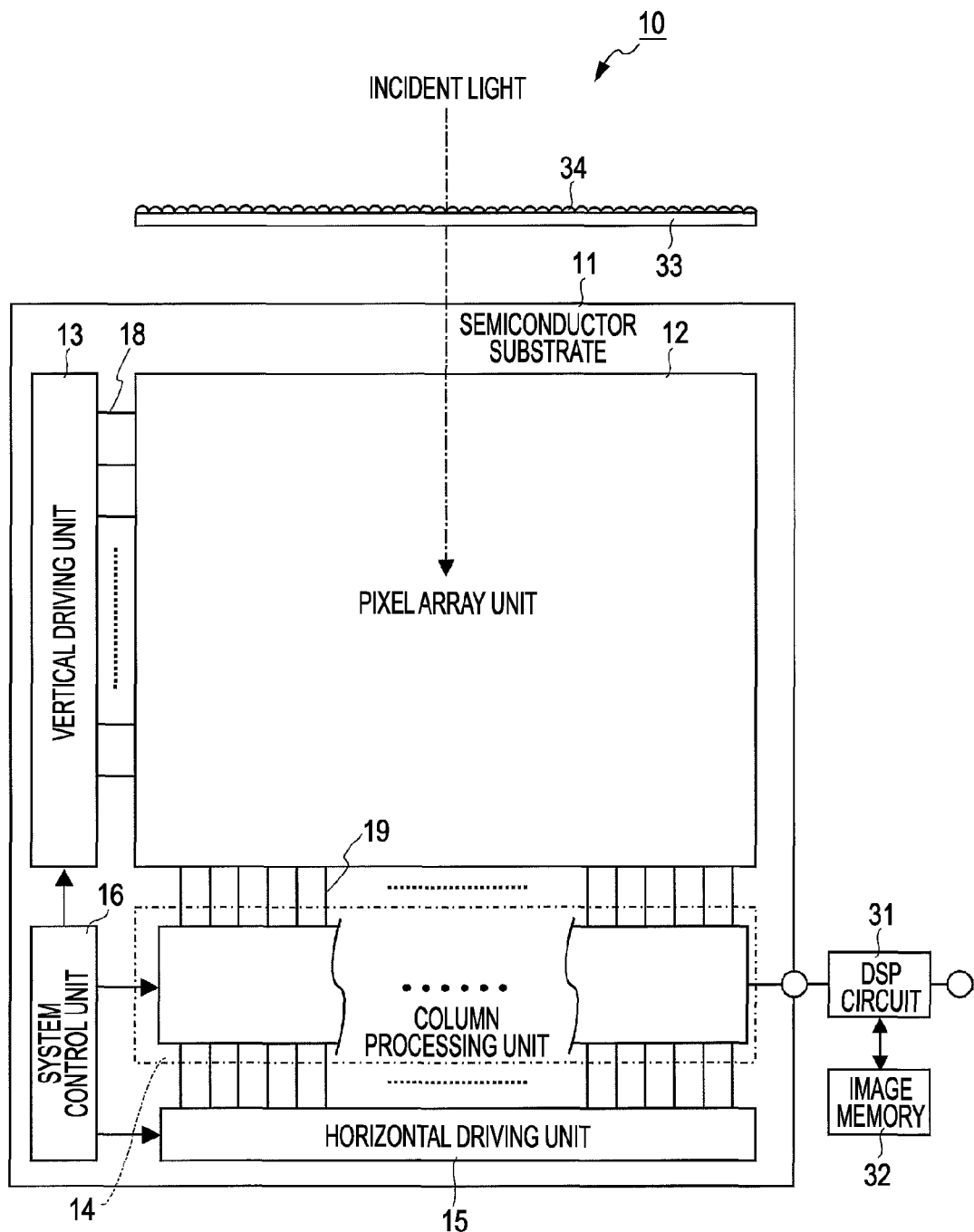
FIG. 1 is a system configuration diagram illustrating an outline of the configuration of a CMOS image sensor to which an embodiment of the invention is applied.

FIG. 1 is a system configuration diagram illustrating an outline of the configuration of a CMOS image sensor which is a kind of a solid-state imaging device to which the invention is applied, for example, an X-Y address type solid-state imaging device.

The CMOS image sensor 10 according to an application of the invention includes a pixel array unit 12 formed on a semiconductor substrate (which is also described as a "sensor chip" in the following description) 11, and a peripheral circuit portion integrated on the same semiconductor substrate 11 together with the pixel array unit 12. As the peripheral circuit, for example, a vertical driving unit 13, a column processing unit 14, a horizontal driving unit 15 and a system control unit 16 are provided. Further, a DSP (Digital Signal Processor) circuit 31, which constitutes a signal processing system, and an image memory 32 are provided outside of the sensor chip 11.

In the pixel array unit 12, unit pixels (not shown, which are also described as "pixels" in the following description) are two-dimensionally arranged in a matrix form, each of which includes a photoelectric conversion element that photoelectrically converts incident visible rays into charges corresponding to the amount of light. The detailed circuit configuration of the unit pixel will be described later. A color filter array 33 is arranged over a light receiving surface (light incident surface) of the pixel array unit 12, and a micro lens array 34 is arranged on the color filter array 33.

Further, in the pixel array unit 12, a pixel driving line 18 is provided for each row of the matrix-type pixel array in the right and left direction (pixel array direction of pixel rows/horizontal direction) of FIG. 1, and a vertical signal line 19 is provided for each column thereof in the up and down direction (pixel array direction of pixel columns/vertical direction) of FIG. 1. One end of each pixel driving line 18 is connected to an output terminal corresponding to each row of the vertical driving unit 13. In FIG. 1, each pixel driving line 18 is shown as one line, but the invention is not limited thereto.

The vertical driving unit 13 is formed by a shift register and an address decoder. A detailed configuration of the vertical driving unit 13 is not shown, but the vertical driving unit 13 includes a reading scanning system and a sweep scanning system. The reading scanning system performs selective scanning with respect to unit pixels, from which signals are read, in units of rows.

Meanwhile, the sweep scanning system performs sweep scanning with respect to a read row, for which the reading scanning is performed by the reading scanning system, before the reading scanning by the time of shutter speed, thereby sweeping (resetting) unnecessary charges from the photoelectric conversion elements of the unit pixels of the read row. The unnecessary charges are swept out (reset) by the sweep scanning system, so that a so-called electronic shutter operation is performed. Herein, the electronic shutter operation denotes an operation in which light charges of the photoelectric conversion elements are swept off and exposure is newly started (accumulation of light charges is started).

Signals read by the reading operation performed by the reading scanning system correspond to the amount of light incident after the immediately preceding reading operation or the electronic shutter operation. Further, the period from the reading timing through the immediately preceding reading operation or the sweeping timing through the electronic shutter operation to the reading timing through the reading operation at this time will be accumulation time (exposure time) of light charges in the unit pixel.

Signals output from each unit pixel of the pixel row having been selectively scanned by the vertical driving unit 13 are supplied to the column processing unit 14 through the respective vertical signal lines 19. The column processing unit 14 performs predetermined signal processing with respect to analog pixel signals output from each pixel of a selected row in units of pixel column of the pixel array unit 12.

As the signal processing by the column processing unit 14, for example, CDS (Correlated Double Sampling) processing is performed. According to the CDS processing, after a reset level and a signal level output from each pixel of the selected row are captured, the difference between the levels is calculated, so that signals of pixels of one row are obtained and fixed pattern noise of pixels is removed. The column processing unit 14 may have an A/D conversion function of converting an analog signal into a digital signal.

The horizontal driving unit 15 is formed by a shift register and an address decoder, and sequentially performs selective scanning with respect to circuit parts corresponding to pixel columns of the column processing unit 14. According to the selective scanning by the horizontal driving unit 15, pixel signals processed in the column processing unit 14 in units of pixel columns are sequentially output to the outside of the sensor chip 11. That is, pixel signals corresponding to color coding (color filter array) of the color filter array 33 are output from the sensor chip 11 as raw data.

The system control unit 16 receives clocks supplied from the outside of the sensor chip 11, data indicating an operation mode, and the like, and outputs data such as internal information on the CMOS image sensor 10. Further, the system control unit 16 includes a timing generator that generates various timing signals, and controls the driving of the vertical driving unit 13, the column processing unit 14 and the horizontal driving unit 15 based on the timing signals generated by the timing generator.

The DSP circuit 31, which is an external circuit of the sensor chip 11 temporarily stores, for example, image data of one frame, which is output from the sensor chip 11, in the image memory 32, and performs demosaic processing based on pixel information stored in the image memory 32. As described above, the demosaic processing is processing in which necessary color information is collected from signals of adjacent pixels and added to signals of each pixel having single color information, thereby compensating the color information and creating a full color image.

(Circuit Configuration of Unit Pixel)

Figure 2:
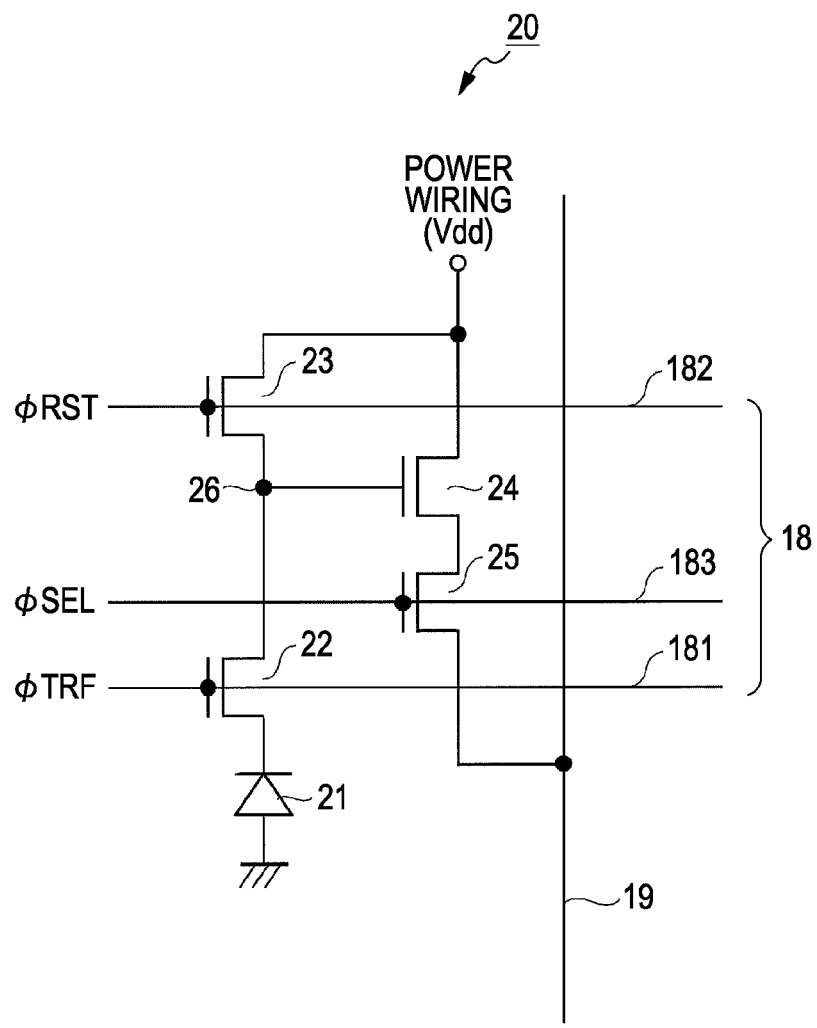
FIG. 2 is a circuit diagram illustrating one example of the circuit configuration of a unit pixel.

FIG. 2 is a circuit diagram illustrating one example of the circuit configuration of a unit pixel 20. As illustrated in FIG. 2, the unit pixel 20 according to the circuit example, includes a photoelectric conversion element (e.g., a photodiode 21), and four transistors including a transfer transistor 22, a reset transistor 23, an amplifying transistor 24 and a select transistor 25.

As the four transistors 22 to 25, for example, N channel MOS transistors are used. A combination of conductivity types of the transfer transistor 22, the reset transistor 23, the amplifying transistor 24 and the select transistor 25 is merely one example. The invention is not limited thereto.

In the unit pixel 20, as the pixel driving line 18, for example, three driving lines including a transmission line 181, a reset line 182 and a selection line 183 are provided in common for each pixel of the same pixel row. Each one end of the transmission line 181, the reset line 182 and the selection line 183 is connected to the output terminal, which corresponds to each pixel row of the vertical driving unit 13, in units of pixel rows.

The photodiode 21 has an anode electrode connected to a negative power source (e.g., ground), and photoelectrically converts received light into light charges (herein, photoelectrons) of charge amount corresponding to the light amount thereof. The photodiode 21 has a cathode electrode electrically connected to a gate electrode of the amplifying transistor 24 via the transfer transistor 22. A node 26 electrically connected to the gate electrode of the amplifying transistor 24 will be referred to as an FD (Floating Diffusion) section.

The transfer transistor 22 is connected between the cathode electrode of the photodiode 21 and the FD section 26. A transmission pulse φTRF, in which a high level (e.g., a Vdd level) is indicative of "active" (hereinafter, referred to as "High active"), is applied to a gate electrode of the transfer transistor 22 through the transmission line 181. The transmission pulse φTRF is applied to the transfer transistor 22 to turn on the transfer transistor 22, so that the light charges photoelectrically converted by the photodiode 21 are transferred to the FD section 26.

The reset transistor 23 has a drain electrode connected to a pixel supply voltage Vdd and a source electrode connected to the FD section 26. A High active reset pulse φRST is applied to a gate electrode of the reset transistor 23 through the reset line 182 prior to the transfer of the signal charges to the FD section 26 from the photodiode 21. The reset pulse φRST is applied to the reset transistor 23 to turn on the reset transistor 23 and the charges of the FD section 26 are swept to the pixel supply voltage Vdd, so that the FD section 26 is reset.

The amplifying transistor 24 has a gate electrode connected to the FD section 26 and a drain electrode connected to the pixel supply voltage Vdd. The amplifying transistor 24 outputs a potential of the FD section 26 reset by the reset transistor 23 as a reset signal (reset level) Vreset. Further, the amplifying transistor 24 outputs the potential of the FD section 26, after the signal charges are transferred by the transfer transistor 22, as a light accumulation signal (signal level) Vsig.

The select transistor 25, for example, has a drain electrode connected to a source electrode of the amplifying transistor 24, and a source electrode connected to the vertical signal line 19. A High active selection pulse φSEL is applied to a gate electrode of the select transistor 25 through the selection line 183. The selection pulse φSEL is applied to the select transistor 25 to turn on the select transistor 25, so that the unit pixel 20 is in a selection state and the signal output from the amplifying transistor 24 is relayed to the vertical signal line 19.

The select transistor 25 may employ a circuit configuration which is connected between the pixel supply voltage Vdd and the drain electrode of the amplifying transistor 24.

Further, the configuration of the unit pixel 20 is not limited to the pixel configuration including the four transistors as described above. For example, the unit pixel 20 may have a pixel configuration including three transistors in which one of them serves as both the amplifying transistor 24 and the select transistor 25, regardless of the configuration of a pixel circuit thereof.

(Pixel Addition)

In general, during moving-image capturing, in order to capture moving images at a high speed by increasing a frame rate, "pixel addition" is performed in which signals of a plurality of pixels adjacent to each other are added and read. The pixel addition can be performed in a pixel, on the vertical signal line 19, by the column processing unit 14, by a signal processing unit of the next stage, and the like. Next, as one example, for example, a pixel configuration when signals of four pixels adjacent to each other in the upper/lower and right/left directions are added in a pixel will be described.

Figure 3:
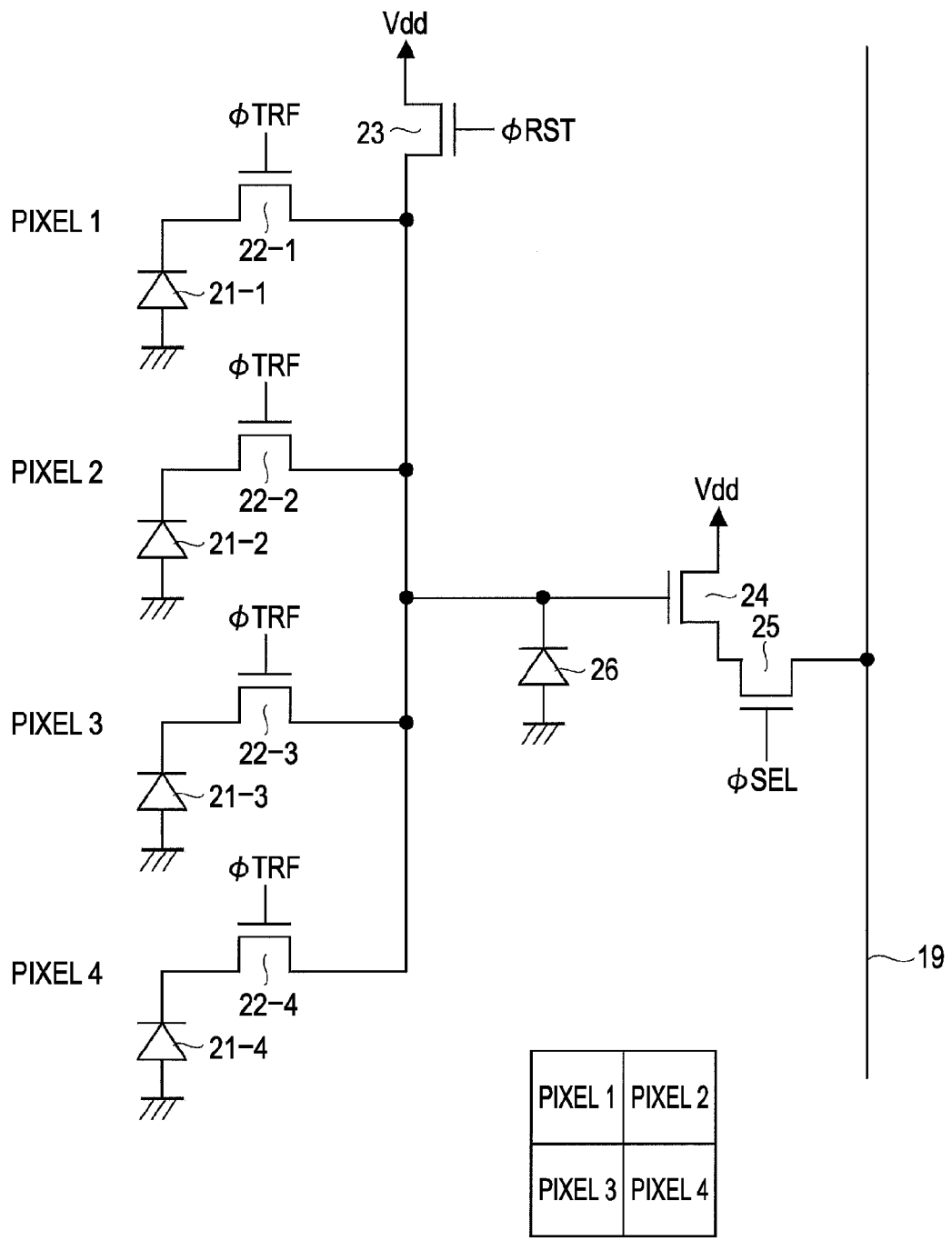
FIG. 3 is a circuit diagram illustrating one example of a circuit configuration when signals of adjacent four pixels are added in a pixel.

FIG. 3 is a circuit diagram illustrating one example of a circuit configuration when signals of adjacent four pixels are added in a pixel. The same reference numerals are used to designate the same elements as those of FIG. 2.

In FIG. 3, the photodiodes 21 of four pixels adjacent to each other in the upper/lower and right/left directions are individually classified into photodiodes 21-1 to 21-4. With respect to the photodiodes 21-1 to 21-4, transfer transistors 22-1 to 22-4 are respectively provided, and one reset transistor 23, one amplifying transistor 24 and one selection transistor 25 are provided.

That is, electrodes on one side of the transfer transistors 22-1 to 22-4 are connected to cathode electrodes of the photodiodes 21-1 to 21-4, and electrodes on the other side of the transfer transistors 22-1 to 22-4 are connected in common to the gate electrode of the amplifying transistor 24. The FD section 26, which is common to the photodiodes 21-1 to 21-4, is connected to the gate electrode of the amplifying transistor 24. The reset transistor 23 has a drain electrode connected to the pixel supply voltage Vdd and a source electrode connected to the FD section 26.

In a pixel configuration corresponding to the configuration in which signals of adjacent four pixels are added, the transmission pulse φTRF is applied to the four transfer transistors 22-1 to 22-4 at the same timing, so that pixel addition between the four pixels adjacent to each other can be realized. That is, signal charges, which are transferred from the photodiodes 21-1 to 21-4 to the FD section 26 through the transfer transistors 22-1 to 22-4, are added (which are also referred to as "FD addition" in the following description) in the FD section 26.

Meanwhile, the transmission pulse φTRF is applied to the transfer transistors 22-1 to 22-4 at timings different from each other, so that signal output in units of pixels can be realized. That is, during moving-image capturing, pixel addition is performed, so that a frame rate can be improved. On the other hand, during still-image capturing, signals of all pixels are independently read out, so that resolution can be improved.

<2. Scope of Main Features of the Invention>

In the above-described CMOS image sensor 10, in order to improve sensitivity of luminance while suppressing degradation of color resolution, the color coding of the color filter array 33 and the demosaic processing in the DSP circuit 31 for reducing the capacity of the image memory 32 are provided. The image memory 32 is used for signal processing such as demosaic processing in the DSP circuit 31.

The color filter array 33 is based on a checkered pattern array, in which two pixels adjacent to each other in at least one of the upper/lower and right/left directions have the same color. According to an embodiment of the invention, in the color coding (color filter array) of the color filter array 33, a spatial sampling point (x, y), that is, the optical pixel center is approximately expressed by the following equation.

That is, in the array of the color filter array 33, the spatial sampling point (x, y) is arranged in at least one of (x=3*(2n−1+oe)+1±2, y=3m−2) and (x=3*(2n−1+oe)+1, y=3m−2±2. Herein, n and m denote an integer, and oe is a coefficient having a value of 0 when m is an odd number and 1 when m is an even number. Further, in the equation of x, ±2 denotes right and left two pixels. In the equation of y, ±2 denotes upper and lower two pixels. The above-described each equation denotes a spatial pixel array (checkered-pattern-based color filter array) in which a checkered pattern array is inclined by 45°.

Further, a color filter array is employed in which, in units of n and m having a specific value, two pixels adjacent to each other in at least one of the upper/lower and right/left directions, preferably, four pixels adjacent to each other in the upper/lower and right/left directions have the same color, so that a checkered-pattern-based color filter array can be realized and the pixel array recorded in the image memory 32 after the demosaic processing can be expressed by (x=2n, y=2m+1). The fact that the recorded pixel array is expressed by (x=2n, y=2m+1) signifies that the number of pixels recorded in the image memory 32 is almost equal to the number of actual pixels of the pixel array unit 12.

As described above, the number of pixels recorded in the image memory 32 is almost equal to the number of actual pixels of the pixel array unit 12, so that the capacity of the image memory 32 can be prevented from being unnecessarily increased. Further, when improving sensitivity of luminance while suppressing degradation of color resolution, the capacity of the image memory 32 necessary for the demosaic processing in the DSP circuit 31 is reduced, so that the cost for the entire system can be reduced.

Hereinafter, a detailed embodiment of the color coding of the color filter array 33 and signal processing thereof will be described.

<3. First Embodiment>

(Color Coding)

Figures 4, 5:
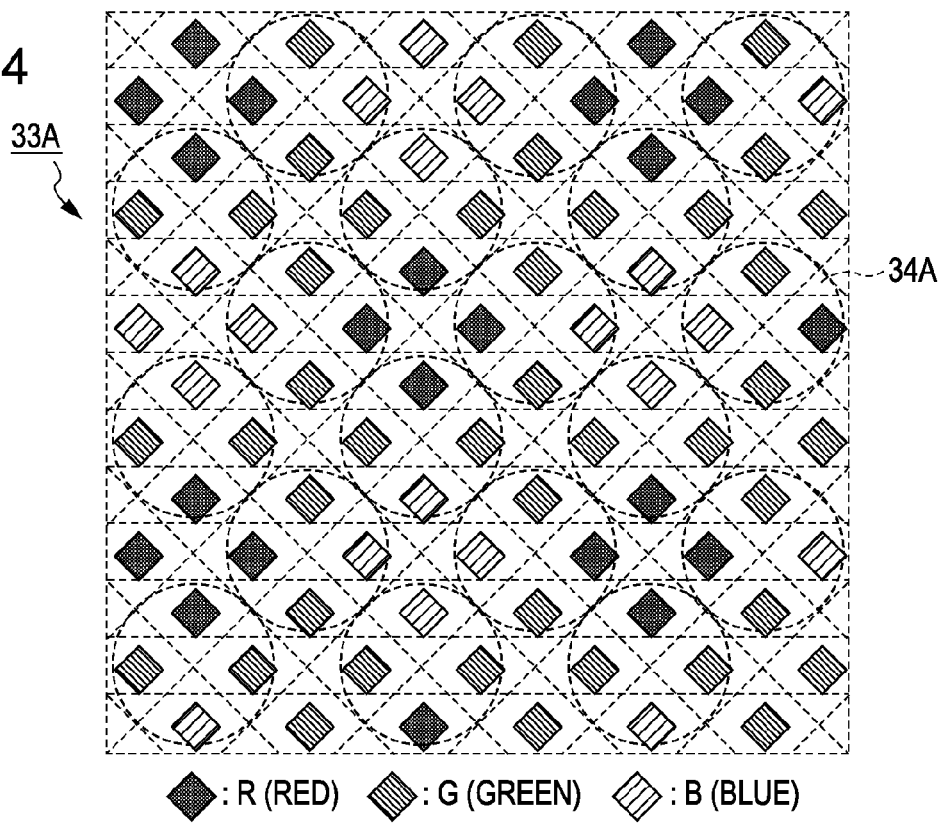
FIG. 4 is a diagram illustrating color coding of a color filter array according to a first embodiment of the invention.
FIG. 5 is a diagram illustrating a state in which optical centers are arranged in an x-y space with respect to color coding of a color filter array according to the first embodiment.

FIG. 4 is a diagram illustrating color coding of a color filter array 33A according to the first embodiment of the invention.

As illustrated in FIG. 4, the color filter array 33A according to the first embodiment employs color coding in which a checkered pattern array in units of adjacent four pixels (n, m=2, 2) of the same color (RGB) is rotated by 45°. In other words, the color coding of the color filter array 33A represents a checkered pattern array obtained by rotating an RGB Bayer array by 45°, in which four pixels adjacent to each other in the upper/lower and right/left directions have the same color. The RGB Bayer array is color coding in which green G filters are arranged in a checkered pattern, and red R filters and blue B filters are arranged in a checkered pattern in remaining parts.

The RGB Bayer array is changed to the checkered pattern array by rotating the RGB Bayer array by 45° and allowing the four pixels adjacent to each other in the upper/lower and right/left directions to have the same color, so that the color coding as illustrated in FIG. 4 is obtained. That is, the color filter array 33A according to the first embodiment employs color coding in which RGB filters are arranged in a square shape in units of four pixels having the same color.

Further, the micro lens array 34 has a configuration in which one micro lens 34A is shared in units of four pixels (vertical two pixels×horizontal two pixels) such that colors different from each other are covered. With such a configuration of the micro lens array 34, optical pixel centers are arranged as illustrated in FIG. 5. FIG. 5 is a diagram illustrating a state in which optical centers are arranged in an x-y space with respect to the color coding of the color filter array 33A.

(Demosaic Processing)

Pixel signals corresponding to the color coding of the color filter array 33A according to the first embodiment are subject to the demosaic processing, in which the checkered pattern array obtained by rotating the RGB Bayer array by 45° is changed to the square array, in the DSP circuit 31 based on pixel signals temporarily stored in the image memory 32.

According to the demosaic processing, when focusing on the resolution of green which serves as a main component of a luminance signal, first, a G signal is generated in the center of adjacent four pixels of G filters in the upper/lower and right/left directions by an interpolation process where, for example, G signals of the four pixels are added to obtain an average value. Further, in relation to remaining pixel parts of R/B filters adjacent to each other in the upper/lower and right/left directions, after two oblique pixels having the same color are added and averaged, the pixel centroid is set in the center thereof.

Figure 6:
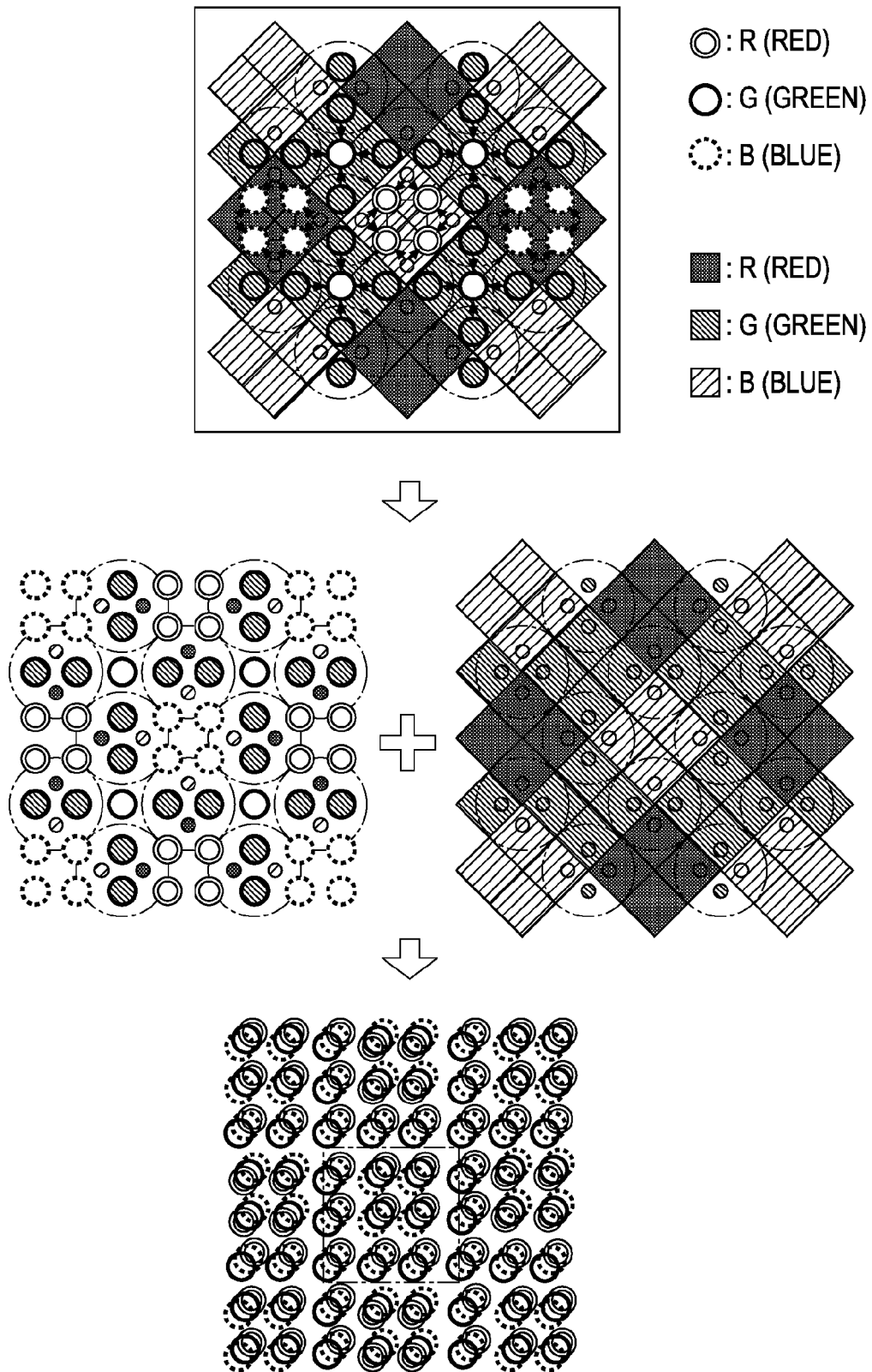
FIG. 6 is a diagram illustrating demosaic processing in the case of color coding according to the first embodiment.

Next, the demosaic processing in the case of the color coding according to the first embodiment will be described in detail with reference to FIG. 6.

First, in relation to a white G part, after determining the directionality (correlation in the longitudinal direction, correlation in the transverse direction and correlation in the oblique direction), pixel information on the white G part is generated based on pixel information on neighboring G pixels, in detail, two G pixels or four G pixels. In relation to remaining pixel parts of R/B adjacent to each other in the upper/lower and right/left directions, after two oblique pixels having the same color are added and averaged or simply added, the pixel centroid is set in the center thereof (centroid shift).

Next, RGB filters in the micro lens 34A are approximately regarded as the same position to obtain a color correlation. Further, after pixel information on the G filter is developed to all pixels on the basis of the color correlation, pixel information on the R/B filters is developed. Through the series of processes as described above, the demosaic processing is completed, in which the checkered pattern array obtained by rotating the RGB Bayer array by 45° is changed to the square array.

Figures 7, 8:
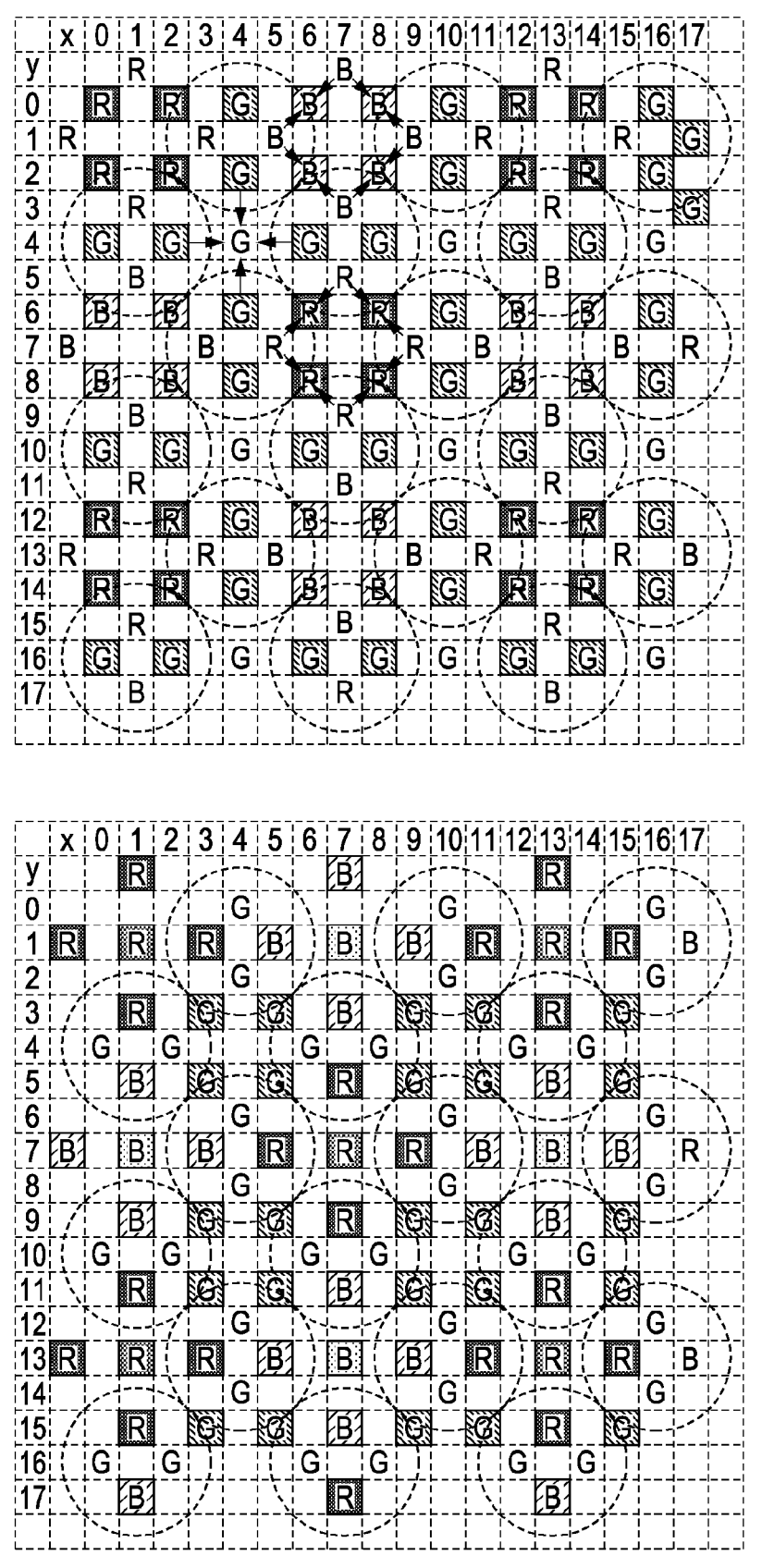

As a result of the demosaic processing, as illustrated in FIG. 7, it is possible to generate pixel signals corresponding to color coding in which signals of each pixel of the RGB filters are uniformly arranged in a square shape. FIG. 7 is a diagram illustrating a pixel array after the demosaic processing for a square array is performed when focusing on the resolution of green which serves as a main component of a luminance signal.

Meanwhile, when focusing on the resolution of red and blue which serve as a main component of a color signal, as illustrated in FIG. 8, first, signals of R/B are generated in the center of adjacent four pixels of R/B filters in the upper/lower and right/left directions by an interpolation process where, for example, pixel signals of the R/B filters of the four pixels are added to obtain an average value. Further, in relation to a remaining pixel part of G filters adjacent to each other in the upper/lower and right/left directions, after two oblique pixels having the same color are added and averaged, the pixel centroid is set in the center thereof.

As a result of the demosaic processing, as illustrated in FIG. 8, it is possible to generate pixel signals corresponding to color coding in which RGB signals are uniformly arranged in a square shape. FIG. 8 is a diagram illustrating a pixel array after the demosaic processing for a square array is performed when focusing on the resolution of red and blue which serve as a main component of a color signal.

As described above, the color filter array 33A of the color coding, in which the checkered pattern array obtained by rotating the RGB Bayer array by 45° is employed and the four pixels adjacent to each other in the upper/lower and right/left directions are allowed to have the same color, is used, so that the capacity of the image memory 32 can be prevented from being unnecessarily increased. Specifically, the number of recorded pixels when pixel signals are stored in the image memory 32 is increased by an amount (9/8=1.125 times) of a pixel part increased, which is interpolated from upper/lower and right/left pixels, with respect to the number of pixels (hereinafter, referred to as "the number of actual pixels") of the pixel array unit 12.

However, since the amount of increase in the number of pixels recorded in the image memory 32 is insignificant, it can be said that the number of recorded pixels is almost equal to the number of actual pixels. Thus, the capacity of the image memory 32 which is necessary for the demosaic processing in the DSP circuit 31 can be reduced, so that the cost for the entire system can be reduced.

<4. Second Embodiment>
(Color Coding)

FIG. 9 is a diagram illustrating color coding of a color filter array 33B according to the second embodiment of the invention.

The color filter array 33B according to the second embodiment employs color coding including a color (e.g., W: White) serving as a main component of a luminance signal. According to the color filter array of the color coding including the white, since an output voltage is high as compared with the color filter array of the RGB Bayer array, high sensitivity of the CMOS image sensor 10 can be achieved.

Specifically, the color filter array 33B according to the second embodiment employs color coding in which a checkered pattern array in units of adjacent four pixels having the same color (WRGB) is rotated by 45°. In other words, the color filter array 33B employs the color coding in which a WRGB checkered pattern array is rotated by 45° using W filters instead of half the G filters in the RGB Bayer array in units of four pixels having the same color. The color filter array 33B according to the second embodiment is different from the color filter array 33A according to the first embodiment in that the color coding in which G filters are arranged in a square shape in units of four pixels is changed to the color coding in which G filters and W filters are arranged in a checkered pattern.

The color coding in which the G filters are arranged in the square shape in units of four pixels is changed to the color coding in which the G filters and W filters are arranged in the checkered pattern, so that the color coding as illustrated in FIG. 9 is obtained. That is, the color filter array 33B according to the second embodiment employs color coding in which WRGB filters are arranged in a square shape in units of four pixels having the same color.

Further, the micro lens array 34 has a configuration in which one micro lens 34B is shared in units of four pixels such that colors different from each other are covered. With such a configuration of the micro lens array 34, optical pixel centers are arranged as illustrated in FIG. 10. FIG. 10 is a diagram illustrating a state in which optical centers are arranged in an x-y space with respect to the color coding of the color filter array 33B.

(Demosaic Processing)

Pixel signals corresponding to the color coding of the color filter array 33B according to the second embodiment are subject to the demosaic processing, in which the color coding (checkered pattern array) obtained by rotating the WRGB Bayer array by 45° is changed to the square array, in the DSP circuit 31 based on pixel signals temporarily stored in the image memory 32.

According to the demosaic processing, when focusing on the resolution of white and green which serve as a main component of a luminance signal, first, a G signal is generated in the center of adjacent four W/G pixels in the upper/lower and right/left directions by an interpolation process where, for example, W/G pixel signals of the four pixels are added to obtain an average value. Further, in relation to remaining R/B pixel parts adjacent to each other in the upper/lower and right/left directions, after two oblique pixels having the same color are added and averaged, the pixel centroid is set in the center thereof.

Figures 11, 12:
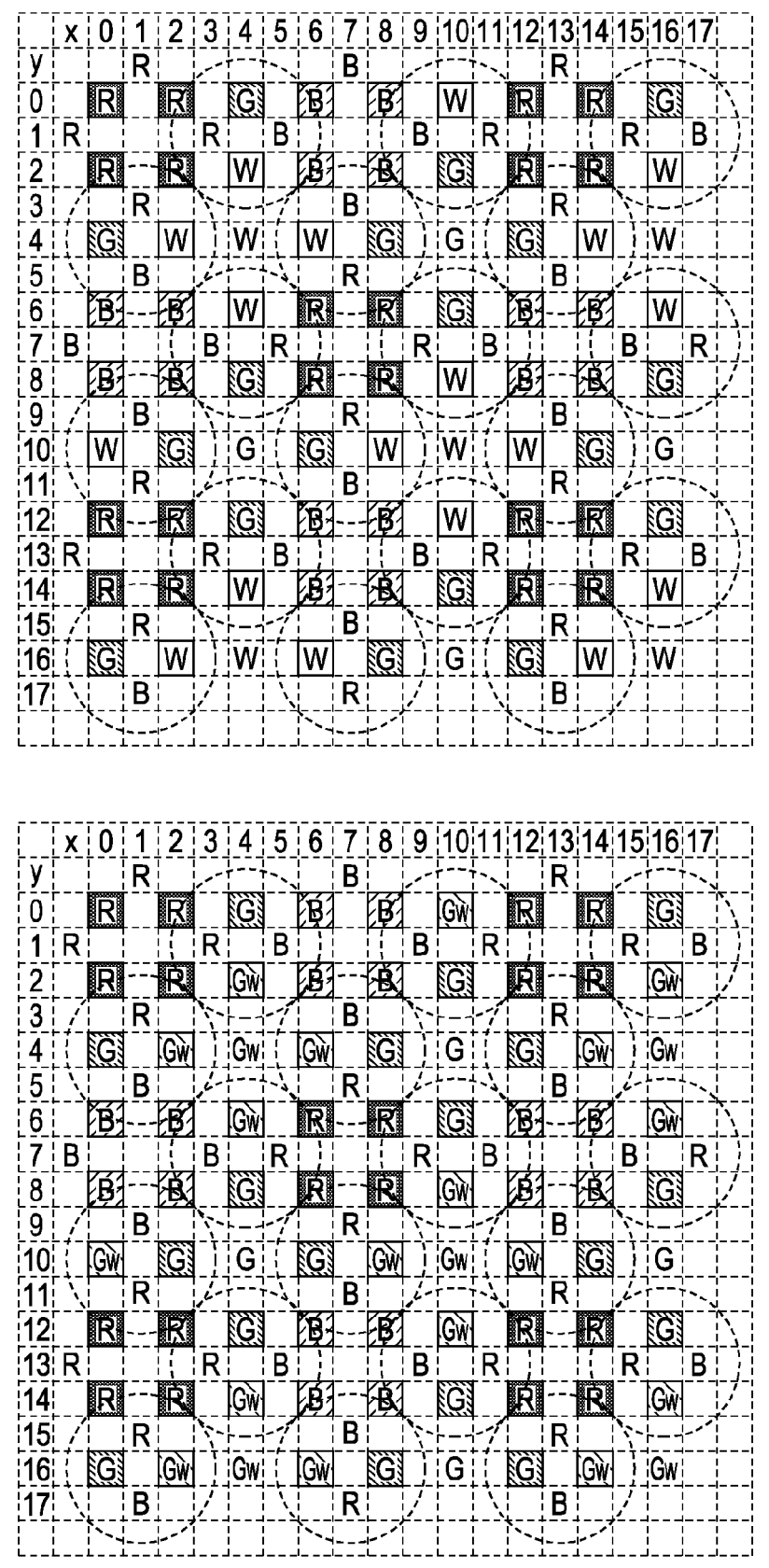

As a result of the demosaic processing, as illustrated in FIG. 11, it is possible to generate pixel signals corresponding to color coding in which WRGB signals are uniformly arranged in a square shape. FIG. 11 is a diagram illustrating a pixel array after the demosaic processing for a square array is performed when focusing on the resolution of white and green which serve as a main component of a luminance signal. The case of focusing on the resolution of R and B which serves as a main component of a color signal is identical to the case of the color filter array 33A according to the first embodiment.

Figures 13, 14:
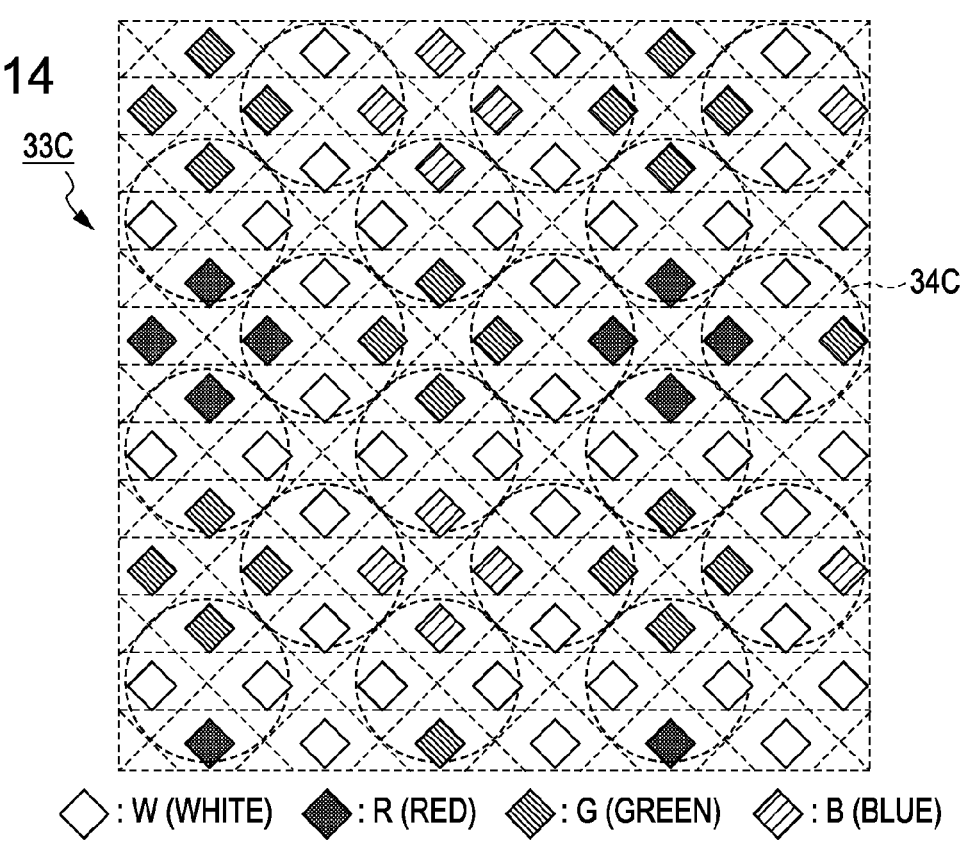
FIG. 13 is a diagram illustrating a pixel array after demosaic processing is performed by defining Wg as (G+R+B)
FIG. 14 is a diagram illustrating color coding of a color filter array according to a third embodiment of the invention.

In the WRGB color coding, it is general to generate the luminance signal from pixel signals of green and white. In such a case, in order to prevent degradation of resolution or deterioration of color reproduction, when demosaic processing is performed to change the color filter array shown in FIG. 10 to the square array, the following demosaic processing is preferably performed. That is, after WRGB filters in the same micro lens 34B are approximately regarded as the same spatial position, and Gw is defined by (W−R−B) as shown in FIG. 12 or Wg is defined by (G+R+B) as shown in FIG. 13, the demosaic processing is performed.

After Gw is defined by (W−R−B) and the demosaic processing is performed as shown in FIG. 12, the pixel array of FIG. 7 is obtained, so that it is advantageous in that the following signal processing can be performed in common. Meanwhile, after Wg is defined by (G+R+B) and the demosaic processing is performed as shown in FIG. 13, R/B components are included and an output signal level of W/Wg becomes large, so that it is advantageous in that a high luminance SNR (signal-to-noise ratio) is obtained.

Even when using the color filter array 33B of the color coding according to the second embodiment as described above, it is possible to achieve effects the same as the effects obtained when using the color filter array 33A of the color coding according to the first embodiment. That is, the capacity of the image memory 32 which is necessary for the demosaic processing in the DSP circuit 31 can be reduced, so that the cost for the entire system can be reduced.

<5. Third Embodiment>
(Color Coding)

FIG. 14 is a diagram illustrating color coding of a color filter array 33C according to the third embodiment of the invention.

As illustrated in FIG. 14, the color filter array 33C according to the third embodiment employs color coding in which a W checkered pattern array in units of adjacent four pixels having the same color (WRGB) is rotated by 45°. That is, in the color filter array 33C, the green arranged in the square shape in units of the four pixels having the same color of the color filter array 33A according to the first embodiment is replaced with white. Various types of array may be applied to the remaining RGB square array. The color coding in the third embodiment is one example typically proposed.

Figure 15:
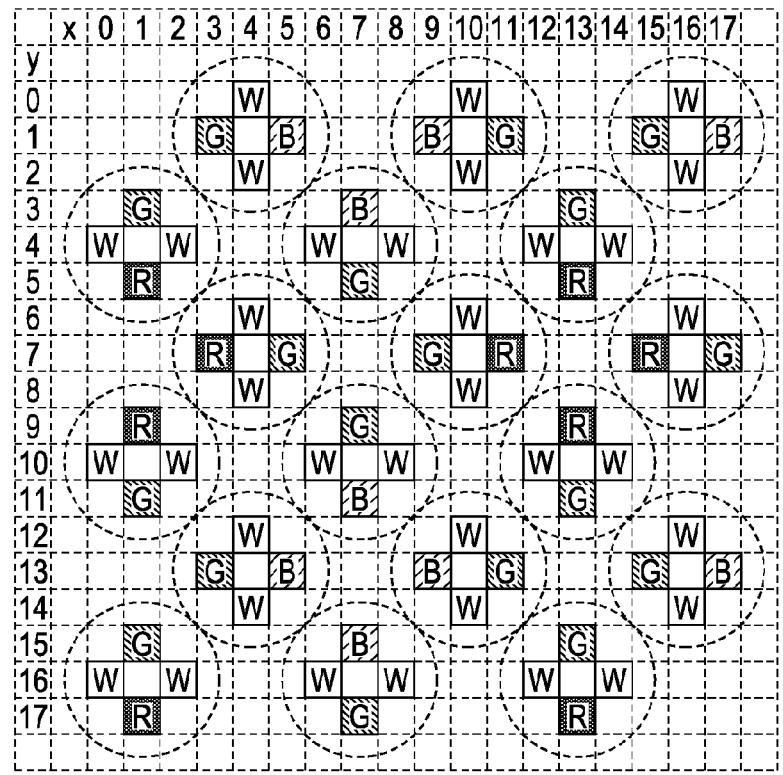
FIG. 15 is a diagram illustrating a state in which optical centers are arranged in an x-y space with respect to color coding of a color filter array according to the third embodiment.

Similarly to the first and second embodiments, the micro lens array 34 has a configuration in which one micro lens 34C is shared in units of four pixels such that colors different from each other are covered. With such a configuration of the micro lens array 34, optical pixel centers are arranged as illustrated in FIG. 15. FIG. 15 is a diagram illustrating a state in which optical centers are arranged in an x-y space with respect to the color coding of the color filter array 33C.

(Demosaic Processing)

Pixel signals corresponding to the color coding of the color filter array 33C according to the third embodiment are subject to the demosaic processing, which is identical to that described in the first embodiment, in the DSP circuit 31. According to the demosaic processing, when focusing on the resolution of white and green which serve as a main component of a luminance signal, first, a G signal is generated in the center of adjacent four W/G pixels in the upper/lower and right/left directions by an interpolation process where, for example, W/G pixel signals of the four pixels are added to obtain an average value. Further, in relation to remaining R/B pixel parts adjacent to each other in the upper/lower and right/left directions, after two oblique pixels having the same color are added and averaged, the pixel centroid is set in the center thereof.

Figure 16:
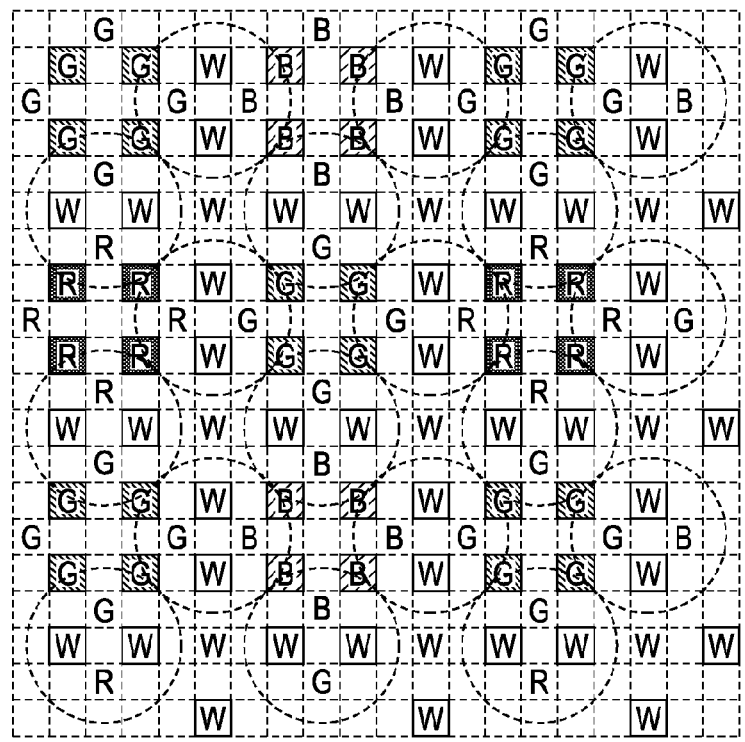
FIG. 16 is a diagram illustrating a pixel array after demosaic processing for a square array is performed when focusing on the resolution of white/green which serve as a main component of a luminance signal.

As a result of the demosaic processing, as illustrated in FIG. 16, it is possible to generate pixel signals corresponding to color coding in which WRGB signals are uniformly arranged in a square shape. FIG. 16 is a diagram illustrating a pixel array after the demosaic processing for a square array is performed when focusing on the resolution of W/G which serve as a main component of a luminance signal.

Meanwhile, when focusing on the resolution of red, blue and green, the demosaic processing, which is basically identical to that described in the first embodiment, is basically performed. Specifically, first, RGB signals are generated in the center of adjacent four pixels of red, blue and green in the upper/lower and right/left directions by an interpolation process where, for example, RGB signals of the four pixels are added to obtain an average value.

Figure 17:
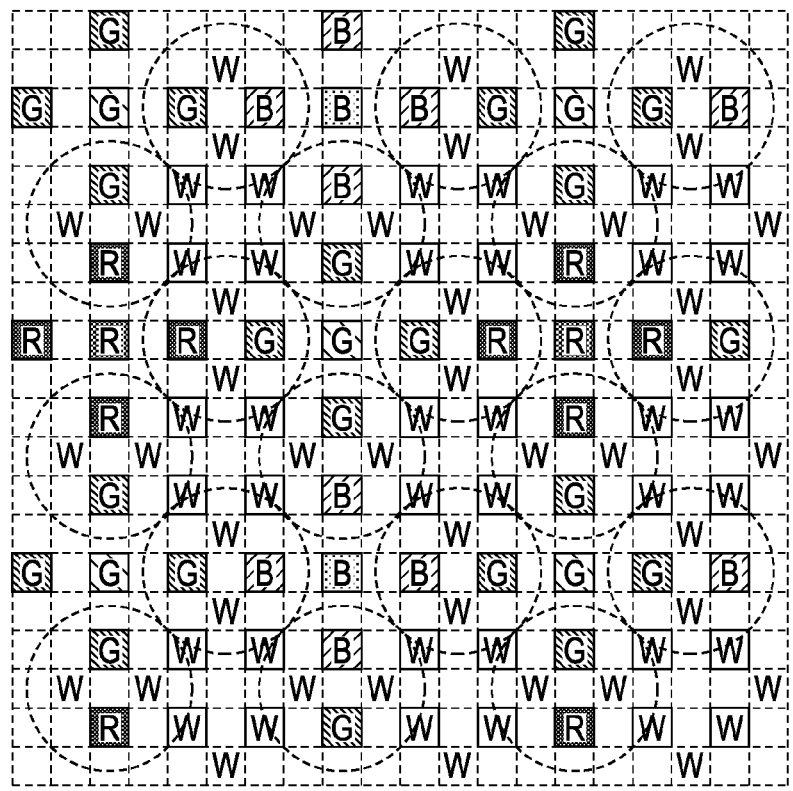
FIG. 17 is a diagram illustrating a pixel array after demosaic processing for a square array is performed when focusing on the resolution of RGB.

As a result of the demosaic processing, as illustrated in FIG. 17, it is possible to generate pixel signals corresponding to color coding in which WRGB signals are uniformly arranged in a square shape. FIG. 17 is a diagram illustrating a pixel array after the demosaic processing for a square array is performed when focusing on the resolution of red, blue and green.

In the first and third embodiments, when the demosaic processing is performed with respect to all colors from the pixel array of FIG. 7 and FIG. 16, it is considered that green or white is initially interpolated and developed to all pixels, and then color correlation is determined and each component of red, blue or green, which is necessary for a green or white part, is generated. At this time, light receiving centers of RGB pixels in the micro lens 34A of FIG. 7 or light receiving centers of WRG/WGB pixels in the micro lens 34C of FIG. 16 are so-called shifted, so that the light receiving centers can be approximately regarded as the same spatial position. The shifting represents that an optical pixel center serving as an optical center approaches the center of the micro lens 34A or 34C.

As described above, the RGB pixels in the micro lens 34A or the WRG/WGB pixels in the micro lens 34C can be approximately regarded as the same spatial position, so that the color correlation can be readily obtained before the demosaic processing is performed. Thus, the circuit size for the demosaic processing can be reduced. Particularly, in order that the white includes RGB components, the demosaic processing can be accurately performed with respect to all colors of all pixels from the WGR pixels of FIG. 16 and the WGB pixels of FIG. 17.

Using the color filter array 33C of the color coding according to the third embodiment as described above, it is possible to achieve effects the same as the effects obtained when using the color filter array 33A of the color coding in the first embodiment. That is, the capacity of the image memory 32 which is necessary for the demosaic processing in the DSP circuit 31 can be reduced, so that the cost for the entire system can be reduced.

Next, when the color coding according to the third embodiment is employed as an example, a spatial sampling point (x, y) and an output sampling point (x, y) of the color filter array 33 will be described.

Figures 18A, 18B:
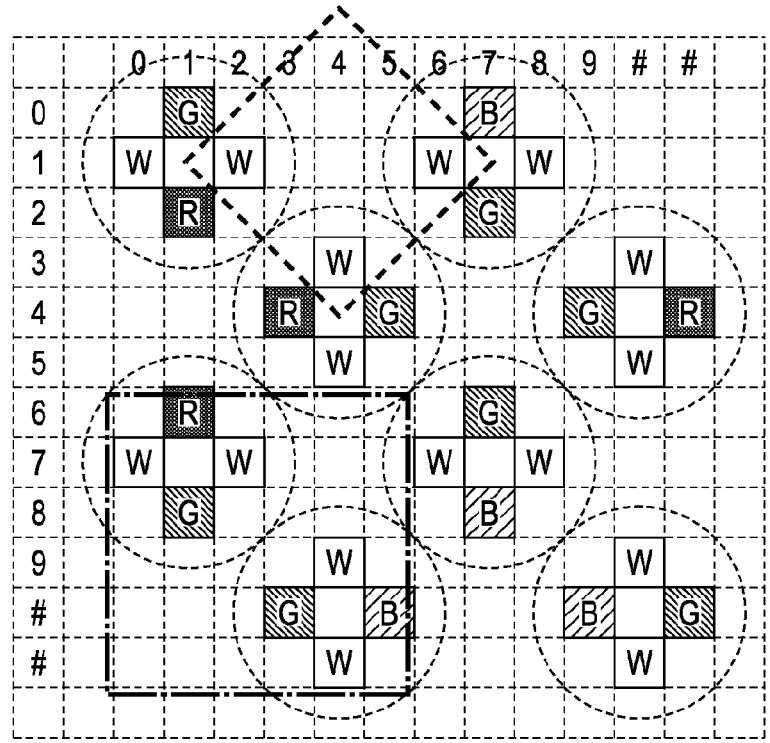
FIGS. 18A and 18B are diagrams illustrating a spatial sampling point in the case of color coding according to the third embodiment.

FIGS. 18A and 18B are diagrams illustrating the spatial sampling point (x, y). FIG. 18A corresponds to FIG. 15 in which the optical center of the color filter array 33 is arranged in an x-y space, and FIG. 18B illustrates the spatial sampling point (x, y).

As described above, in the color coding of the color filter array 33, a spatial sampling point (x, y), that is, the optical pixel center is approximately expressed by $(x=3*(2n-1+oe)+1\pm2, y=3m-2)$ and $(x=3*(2n-1+oe)+1, y=3m-2\pm2)$. Herein, n and m denote an integer, and oe has a value of 0 when m is an odd number and 1 when m is an even number.

In FIG. 18B, spatial sampling points of the W filters are illustrated when m is 1 and oe is 0 in the first row and the second row, spatial sampling points of the G/R filters are illustrated when m is 2 and oe is 1 in the third row and the fourth row, spatial sampling points of the W filters are illustrated when m is 3 and oe is 0 in the fifth row and the sixth row, spatial sampling points of the B/G filters are illustrated when m is 4 and oe is 1 in the seventh row and the eight row, and spatial sampling points of the W filters are illustrated when m is 5 and oe is 0 in the ninth row and the tenth row.

For example, in the first row and the second row, the initial four spatial sampling points (x, y) represent spatial sampling points of the W filters of four pixels which are adjacent in the upper/lower and right/left directions and surrounded by broken lines of FIG. 18A. That is, in the four pixels surrounded by the broken lines, the spatial sampling point (x, y) of the left pixel is (2, 1) and the spatial sampling point (x, y) of the upper pixel is (4, −1). Further, the spatial sampling point (x, y) of the right pixel is (6, 1) and the spatial sampling point (x, y) of the lower pixel is (4, 3).

FIGS. 19A and 19B are diagrams illustrating the output sampling point (x, y). FIG. 19A corresponds to FIG. 16 illustrating the pixel array after the demosaic processing for the square array is performed when focusing on the resolution of W/G, and FIG. 19B illustrates the output sampling point $(x=2n, y=2m+1)$.

Eight pixels indicated by dashed dotted lines in spatial sampling become nine pixels indicated by dashed dotted lines because one pixel interpolated from upper, lower, right and left pixels is increased. Thus, as described above, the number of pixels recorded in the image memory 32 is increased by 1.125 (⅜) times relative to the number of actual pixels. However, as described above, since the amount of increase in the number of recorded pixels is insignificant, the capacity of the image memory 32 which is necessary for the demosaic processing in the DSP circuit 31 can be reduced.

Figures 20A, 20B:
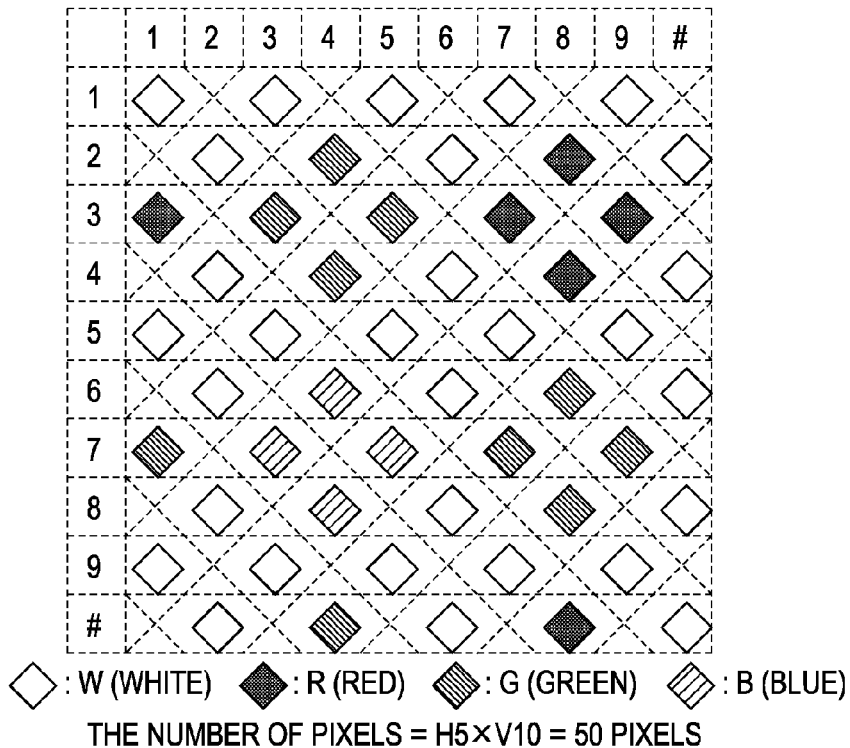
FIGS. 20A and 20B are diagrams illustrating a spatial sampling point according to the related art.

In the related art according to Japanese Unexamined Patent Application Publication No. 2007-235888, when the checkered pattern array is converted to the square array, the pixel information on the center of four pixels is generated through the demosaic processing from the peripheral pixels. FIGS. 20A and 20B are diagrams illustrating a spatial sampling point (x, y) according to the related art. FIG. 20A illustrates a color filter array in which optical centers of a color filter array are arranged in an x-y space, and FIG. 20B illustrates the spatial sampling point (x, y).

In the related art, the spatial sampling point (x, y) is expressed by $(x=2*(2n-1+oe)\pm1, y=2m-1)$ and $(x=2*(2n-1+oe), y=2m-1\pm1)$. Herein, n and m denote an integer, and oe has a value of 0 when m is an odd number and 1 when m is an even number. When the number of pixels in spatial sampling is defined as 50 (horizontal five pixels×vertical ten pixels), the pixel information on the center of the four pixels is generated through the demosaic processing from the peripheral pixels, so that 100 pixels (horizontal ten pixels×vertical ten pixels), which is twice the number of actual pixels, are used in output sampling. That is, the capacity of the image memory 32, which is twice the capacity corresponding to the number of actual pixels, is necessary.

In the first to third embodiments as described above, the micro lenses constituting the micro lens array 34 are shared in units of four pixels such that colors different from each other are covered. However, embodiments of the invention are not limited thereto. That is, even when employing a configuration in which micro lenses are provided in units of pixels, the color coding according to the first to third embodiments is employed, so that the capacity of the image memory 32 can be reduced and the system cost can be lowered.

Further, the four pixels serving as a unit are shifted, that is, the optical pixel center (light receiving center) approaches the center of the micro lens, so that the center of the four pixels can serve as a spatial area. Thus, it is advantageous in that the spatial area can be used as a wiring area.

[Same Color-Based four-Pixel Addition]

Hereinafter, in relation to the color filter arrays 33A to 33C according to the first to third embodiments, in the color coding in which four pixels adjacent to each other in the upper/lower and right/left directions have the same color, pixel addition (same color-based four-pixel addition) in which signals of the four pixels having the same color are added will be described.

When the same color-based four-pixel addition is performed, since the four pixels to be added are adjacent to each other, for example, the above-described FD addition (refer to FIG. 3) is used, so that the four-pixel addition can be realized. Hereinafter, the same color-based four-pixel addition will be described in detail with reference to FIG. 21 by employing the color coding according to the first embodiment as an example. FIG. 21 is a diagram illustrating the same color-based four-pixel addition in the color coding according to the first embodiment. It can be said that the case of the color coding according to the third embodiment is basically identical to the color coding according to the first embodiment.

In the color coding according to the first embodiment illustrated in FIG. 4, addition (e.g., FD addition) is performed with respect to each RGB pixel among adjacent four pixels, so that a color filter array after the pixel addition becomes a checkered pattern array. Thus, an existing signal processing system of a typical checkered pattern array can be adapted to signal processing after the same color-based four-pixel addition. Further, the pixel addition is performed, so that the high speed moving-image capturing can be realized and sensitivity can be improved as described above. In the case of four-pixel addition, sensitivity is basically four times as high as that when pixel addition is not performed.

In addition, after the four-pixel addition is performed, resolution is basically lowered to ¼. However, since the checkered pattern array is obtained at the time point at which the four-pixel addition is performed, the amount of information becomes twice through the demosaic processing as is obvious from the description of the related art as described above. Thus, in spite of the four-pixel addition, the number of pixels recorded in the image memory 32 (recorded resolution) is reduced to ½ of the case of full pixels for which pixel addition is not performed. That is, in the color coding in which four pixels adjacent to each other in the upper/lower and right/left directions have the same color, the four-pixel addition in which signals of the four pixels having the same color are added is performed, so that degradation of color resolution, which is a problem during pixel addition, can be minimized and sensitivity of luminance can be improved.

In the above description, the pixel addition among the adjacent four pixels is performed in a pixel by using the FD addition. However, the invention is not limited to the pixel addition in a pixel. As described above, the pixel addition can be performed on the vertical signal line 19, by the column processing unit 14, by a signal processing unit of the next stage, and the like. In any case of using the pixel addition, the above-described effects can be obtained, that is, degradation of color resolution can be minimized and sensitivity of luminance can be improved.

In the above example, the same color-based four-pixel addition is performed using the FD section 26 (refer to FIG. 2) which is provided in common for the four pixels adjacent to each other. However, addition of two pixels of the same color, which are point-symmetrical to each other among four pixels, can be performed.

[Shift Array]

Hereinafter, a shifted pixel array (shift array) in which the optical pixel center approaches the center of the micro lens will be described.

Figure 22A:
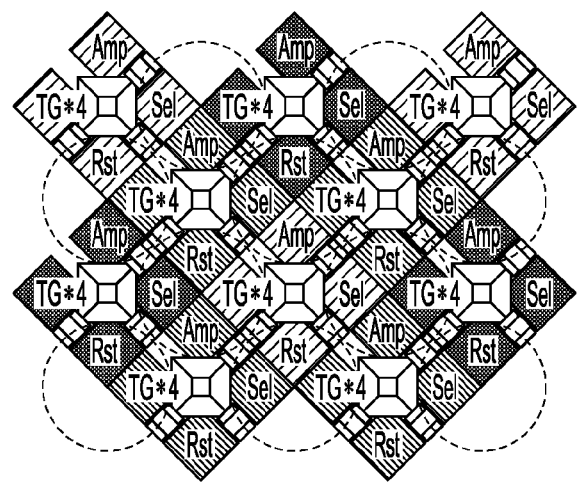
FIGS. 22A and 22B are diagrams illustrating a shift array in the case of a color filter array according to the first embodiment.
Figure 22B:
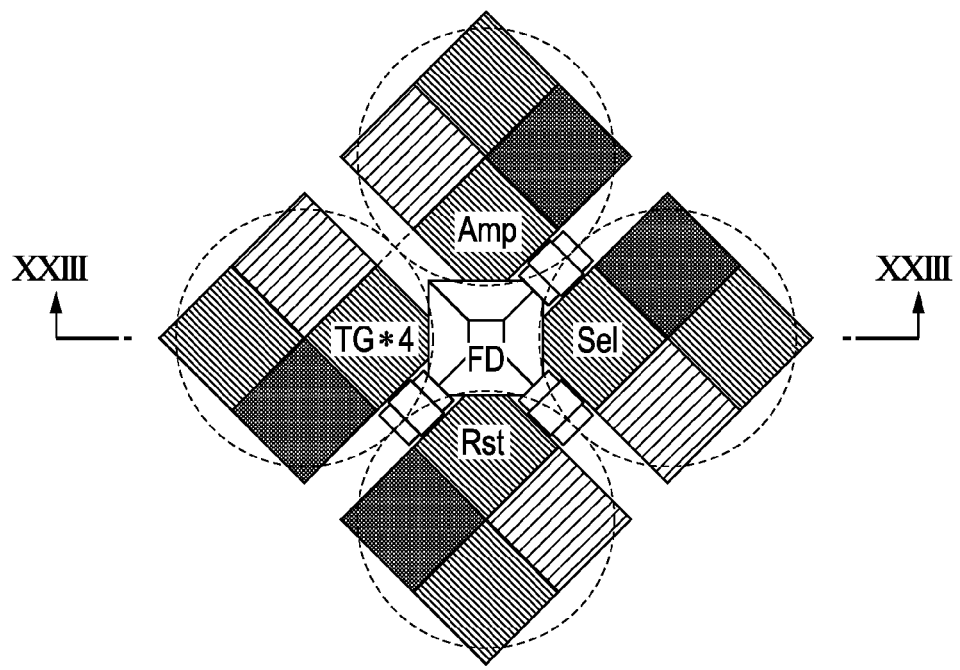

The shift array will be described with reference to FIGS. 22A and 22B by employing the color filter array according to the first embodiment as an example. FIG. 22A is a diagram illustrating the color coding of the color filter array 33A according to the first embodiment and FIG. 22B is an enlarged diagram illustrating a part of the color coding.

For example, when each micro lens 34A of the micro lens array 34 has a circular shape when seen in a plan view, gaps occur between the micro lenses 34A. The gaps between the micro lenses 34A or a dead zone of the micro lenses 34A can be effectively used when arranging other circuit elements than the photodiode of the unit pixel 20, particularly, pixel forming elements in the case of employing the pixel configuration of FIG. 3 in which the above-described FD addition is realized.

Specifically, after the FD section 26 shared by four pixels is arranged in a center part of the gaps between the micro lenses 34A, pixel forming elements, that is, the transfer transistors 22-1 to 22-4, the reset transistor 23, the amplifying transistor 24 and the selection transistor 25 are arranged around the FD section 26. Further, the gaps between the micro lenses 34A can be used as a wiring area as well as an arrangement area of the pixel forming elements.

As described above, the pixel forming elements other than the photodiodes 21-1 to 21-4 are arranged by using the gaps between the micro lenses 34A or the dead zone, so that it is possible to realize a circuit element layout not causing an obstruction in light collection of the micro lens 34A. In addition, it is possible to obtain the shift array in which optical centers of the four photodiodes 21-1 to 21-4 in one micro lens 34A approach the center of the micro lens 34A.

The shift array, in which the optical centers of the four photodiodes 21-1 to 21-4 approach the center of the micro lens 34A, is obtained, so that the height "h" of the micro lens 34A can be lowered and the curvature "r" of the lens can be reduced. The height "h" of the micro lens 34A from the light receiving surface of the photodiodes 21-1 to 21-4 and the curvature "r" of the micro lens 34A are determined corresponding to the distance among the photodiodes.

Figure 23A:
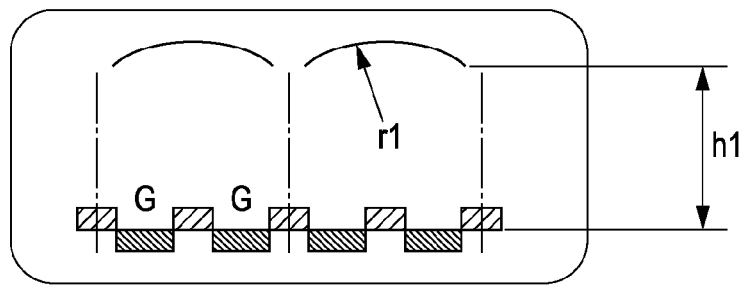
FIGS. 23A and 23B are diagrams illustrating height "h" and curvature "r" of a micro lens.
Figure 23B:
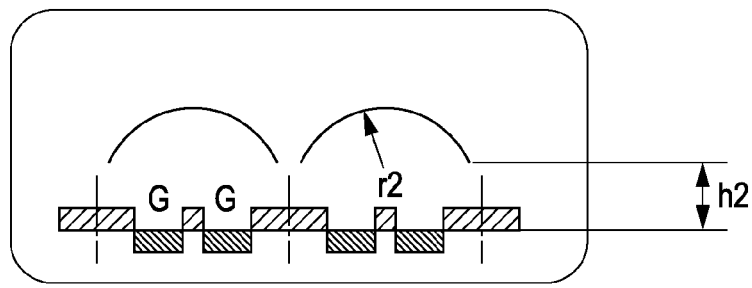

FIGS. 23A and 23B are sectional views taken along line XXIII-XXIII of FIG. 22B. As is obvious from FIGS. 23A and 23B, as compared with the case of FIG. 23A not employing the shift array structure, the distance between the photodiodes is shortened in the case of FIG. 23B employing the shifting array structure, and the height of the micro lens 34A can be lowered (h2<h1) and the curvature r thereof can be reduced (r2<r1). Further, as compared with the case in which the height "h" of the micro lens 34A is high, when employing the case in which the height "h" of the micro lens 34A is low, it is advantageous in that an on-chip configuration of the micro lens array 34 can be easily achieved.

Between the shifted photodiodes 21-1 to 21-4, if necessary, a light shielding structure for preventing color mixture can be provided with the necessary dimension. For example, a wiring of a first layer of a multi-layer wiring arranged over the light receiving surface of the photodiodes 21-1 to 21-4 is used as a light shielding layer, or another metal layer is used as a wiring layer in the right oblique direction and the left oblique direction, so that the light shielding structure for preventing color mixture can be realized.

Meanwhile, the gaps between the four micro lenses 34A adjacent to each other serve as a center position of four pixels having filters of the same color. Thus, the FD section 26 shared by the four pixels through the transfer transistors 22-1 to 22-4 is employed, so that the four-pixel addition based on charge addition in the FD section 26 becomes possible as described above. In addition, as described above, the high speed moving-image capturing, in which the number of pixels is added and compressed by the pixel addition, can be realized.

The example in which the color filter array 33A according to the first embodiment is employed has been described. However, it can be said that the case of the color filter array 33B according to the second embodiment or the color filter array 33c according to the third embodiment is similar to the case of the color filter array 33A according to the first embodiment.

[Phase Difference Detection]

The first to third embodiments employ a configuration in which one micro lens 34A, 34B or 34C is shared in units of four pixels (vertical two pixels×horizontal two pixels) such that colors different from each other are covered. Two of four pixels serving as a unit have the same color in the first and third embodiments among the embodiments.

Specifically, in the case of the color coding according to the first embodiment, as is obvious from FIG. 4, the R and B filters each correspond to one pixel and the G filter corresponds to two pixels. In the case of the third embodiment, as is obvious from FIG. 14, the G and B filters/the G and R filters each correspond to one pixel and the W filter corresponds to two pixels. That is, as compared with the R/B pixels, the G/W pixels, which serve as a main component of a luminance signal having a high output amount, correspond to two of the four pixels.

As described above, when the W/G pixels, which serve as the main component of the luminance signal, are arranged in a square shape in units of checkered-pattern four pixels of the same color adjacent to each other, the G/W pixels are arranged longitudinally and transversely by two pixels in one micro lens in units of matrixes of the micro lens array 34A. In the pixel array, two pixels of the same color in one micro lens can be used as a phase difference sensor that detects the phase difference of two rays of incident light.

Specifically, in a row having micro lenses with the transversely arranged two G/W pixels arranged in a row in the transverse direction, the phase difference of two rays of light, which are incident on the micro lenses from the transverse direction (row direction), can be detected based on signals of the two G/W pixels. Further, in a column having micro lenses with the longitudinally arranged two G/W pixels arranged in a column in the longitudinal direction, the phase difference of two rays of light, which are incident on the micro lenses from the longitudinal direction (column direction), can be detected based on the signals of the two G/W pixels.

The principle of the phase difference detection will be described with reference to FIG. 24. That is, the case in which the phase difference is detected using signals of two pixels of R filters will be described as an example. This likewise applies to the case of using two pixels of G/B/W filters.

In an image capturing apparatus using the CMOS image sensor 10 as an image capturing element, an image capturing lens 41 is arranged on the side of the light receiving surface of the CMOS image sensor 10, and image light (incident light) from an object 42 are captured in the image capturing lens 41.

Figure 24:
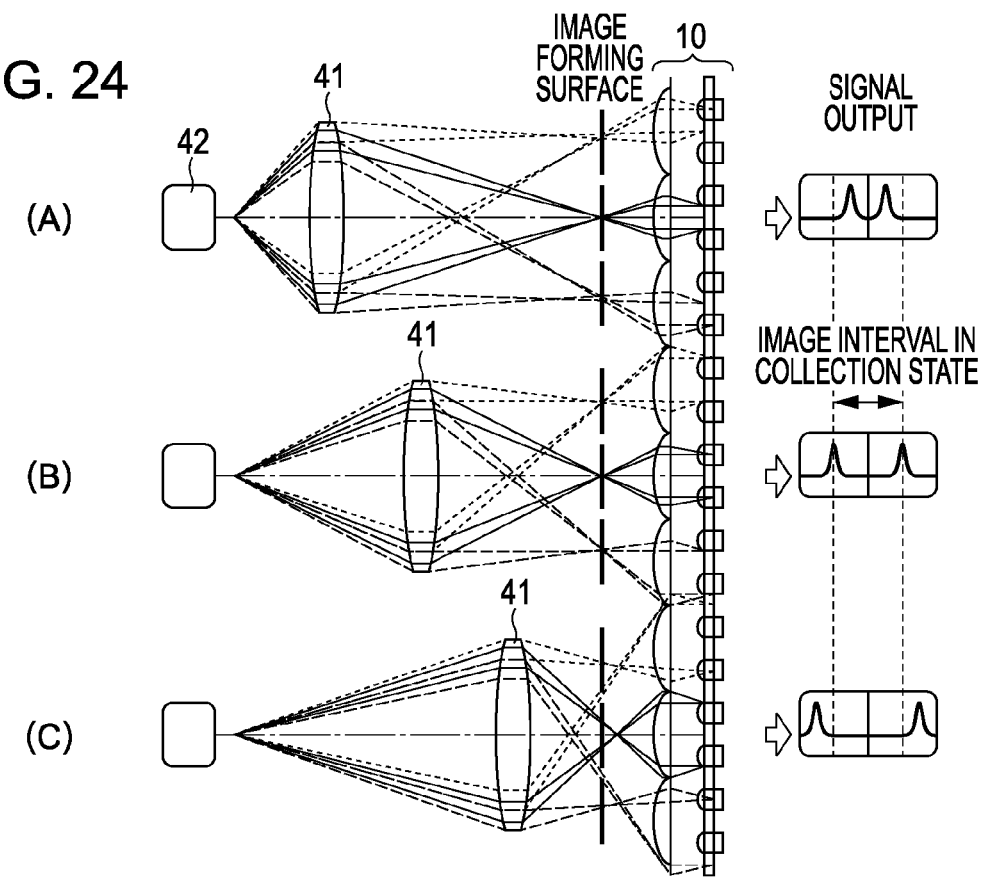
FIG. 24 is a diagram illustrating the principle of phase difference detection.

When the distance between the image capturing lens 41 and the object 42 is formed as the state as illustrated in part (B) of FIG. 24, two rays of incident light are formed on the light receiving surface of two R pixels as an image. When the state as illustrated in part (B) of FIG. 24 is defined as a focusing state, an interval between peaks of the output signals of the two R pixels at this time is equal to the distance between the image capturing lens 41 and the object 42 in the focusing state. The interval between the peaks of the output signals of the two R pixels signifies the phase difference between the two rays of incident light.

In the state illustrated in part (A) where the distance between the image capturing lens 41 and the object 42 is shorter than the distance in the focusing state, the interval between the peaks of the output signals of the two R pixels is narrower than the interval in the focusing state. Further, in the state illustrated in part (C) where the distance between the image capturing lens 41 and the object 42 is longer than the distance in the focusing state, the interval between the peaks of the output signals of the two R pixels is wider than the interval in the focusing state.

As is obvious from the above description, the phase difference of the two rays of incident light can be detected from the interval between the peaks of the output signals of the two pixels of the filters having the same color as information on the optical axis direction of the image capturing lens 41, that is, distance information between the image capturing lens 41 and the object 42. Thus, the two pixels of the filters having the same color are used as a phase difference sensor, so that it is possible to realize an AF (auto focusing) function of controlling the position of the image capturing lens 41 in the optical axis direction based on the distance information between the image capturing lens 41 and the object 42. Since the two pixels of the filters having the same color are used as the phase difference sensor, and the phase difference sensor is used as an AF sensor, it is advantageous in that a dedicated AF sensor for realizing the AF function is not necessary.

In the above description, the case in which the pixels of the R filters are used for phase difference detection has been described as an example. Since the phase difference detection represents that a specific angle of incident light is detected, a part of the incident light may be discarded. Therefore, pixels of high output color filters (G/W filters), which serve as a main component of a luminance signal, are suitable for the phase difference detection. Particularly, the color coding according to the third embodiment, in which white W serves as a main component of a luminance signal, is preferred. In the case of using pixels of G/W filters as the phase difference sensor, the condition of maximizing light collection is suitable for pixels of R/B filters, which serve as a main component of a color signal.

Figure 25A:
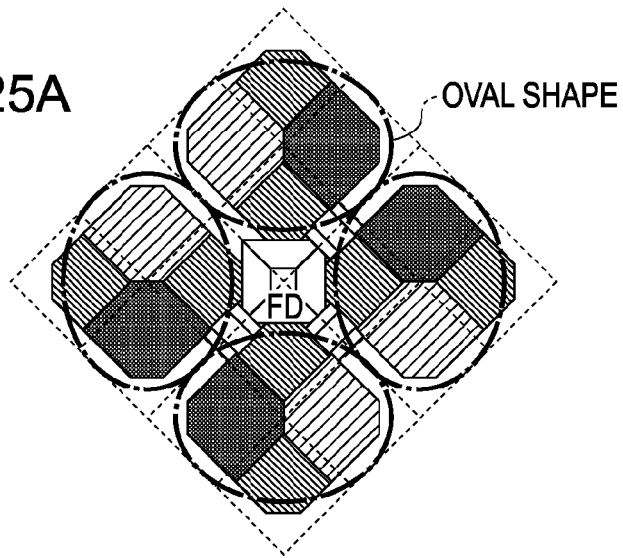
FIGS. 25A to 25C are diagrams illustrating modification of the shape of a micro lens.
Figure 25B:
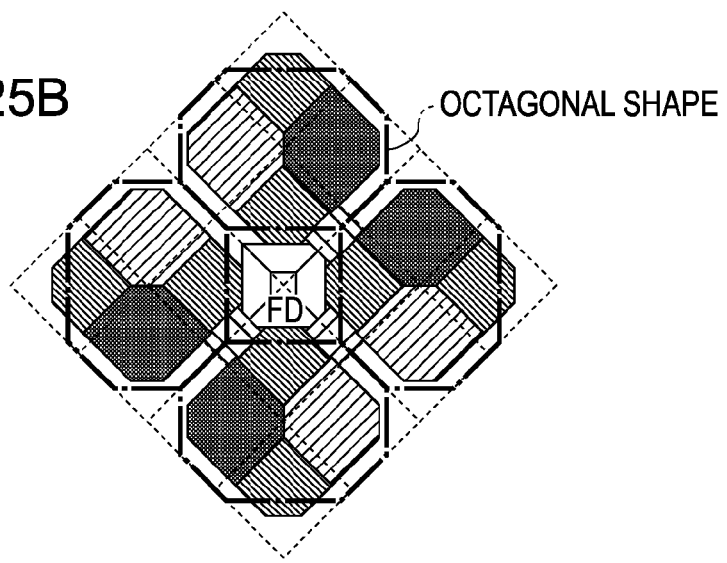
Figure 25C:
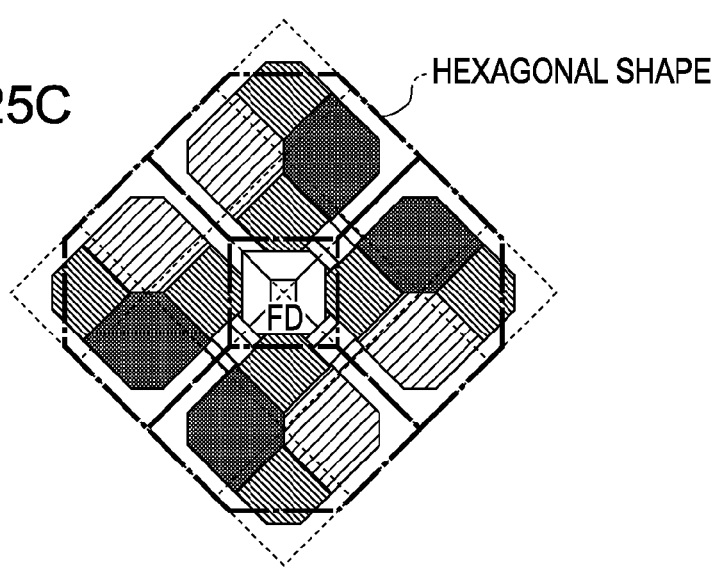

Thus, with respect to the respective pixels of R/B filters, a light receiving area (optical area) of the photodiode and the curvature of the micro lens are allowed to have an optimal value, so that a structure suitable for the phase difference detection can be made to be compatible for a structure suitable for the light collection through the same process. As a specific scheme for obtaining the optimal value, color pixels R/B, G/R or G/B and different light receiving areas of the photodiode are employed, or the curvature of the micro lens is changed in the "n" direction and "m" direction (vertical and horizontal directions). In addition, as illustrated in FIGS. 25A to 25C, it is also considered that the micro lens has an oval shape as illustrated in FIG. 25A, an octagonal shape as illustrated in FIG. 25B, or a hexagonal shape as illustrated in FIG. 25C.

[Parallax Image]

In the above-described phase difference detection, the signals of two pixels with the same color in one micro lens are used. On the other hand, processing of using signals of pixels of all colors in one micro lens is performed, so that it is possible to construct an image capturing apparatus using an existing scheme called "Light Field Photography" which is used for obtaining a two-dimensional parallax image.

As described in the phase difference detection, the information on the image capturing lens in the optical axis direction can be obtained from the signals of the two pixels in one micro lens. Further, signals obtained from four pixels in one micro lens by using the above scheme include information with respect to the parallax. The parallax represents displacement on the appearance of an object seen from various points.

As described above, since the signals obtained from four pixels in one micro lens include the information with respect to the parallax, the processing of using the signals of the pixels of all colors in one micro lens is performed, so that it is possible to construct the image capturing apparatus capable of obtaining the two-dimensional parallax image. Further, the focusing that uses two-dimensional parallax information becomes possible.

<6. Modification of Pixel Array>

The first to third embodiments employ the pixel array (color filter array) in which four pixels adjacent in the upper/lower and right/left directions while serving as a unit of a color filter array have the same color. However, the invention is not limited to the color filter array. For example, the invention can also be applied to a color filter array including four pixels having the same color and two pixels having the same color. Hereinafter, a modification in which the four pixels having the same color exist together with the two pixels having the same color will be described.

[First Modification]

(Color Coding)

Figure 26:
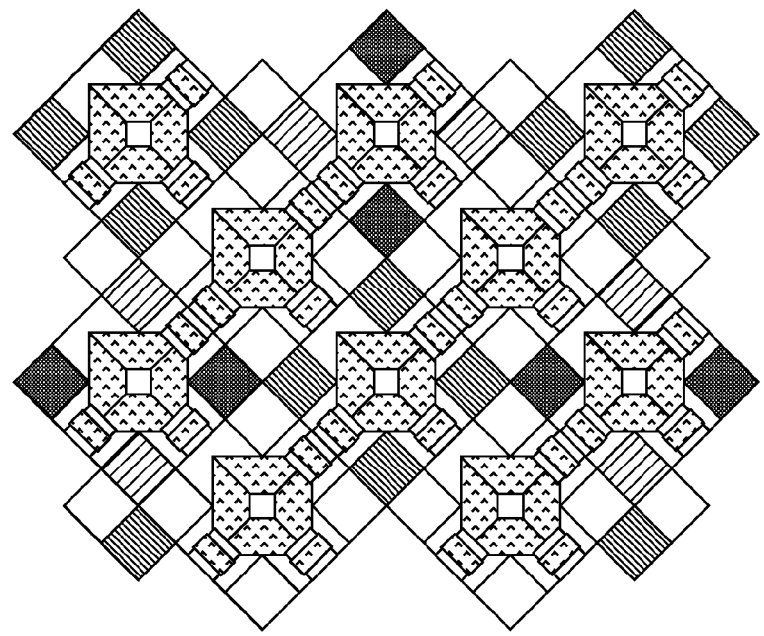
FIG. 26 is a diagram illustrating color coding according to a first modification.

FIG. 26 is a diagram illustrating color coding according to the first modification. The color coding according to the first modification is based on the color coding of the color filter array 33C according to the third embodiment, that is, the color coding in which the W checkered pattern array in units of four pixels is rotated by 45°.

In the first modification, in relation to four pixels of B filters in the color coding according to the third embodiment, the upper and lower two pixels are replaced with the combination of R filters, and right and left two pixels are replaced with the combination of B filters. Further, in relation to four pixels of R filters, the upper and lower two pixels are replaced with the combination of B filters, and right and left two pixels are replaced with the combination of R filters. In relation to four pixels of W/G filters, all the four pixels have the same color.

That is, according to the color coding of the first modification, in the color coding in which the W checkered pattern array in units of four pixels is rotated by 45°, the four pixels have the same color with respect to W/G filters, and two pixels, which are point-symmetrical to each other (face each other), have the same color with respect to R/B filters.

In relation to the micro lens array 34, similarly to the first to third embodiments, one micro lens is shared in units of four pixels such that colors different from each other are covered.

Figure 27:
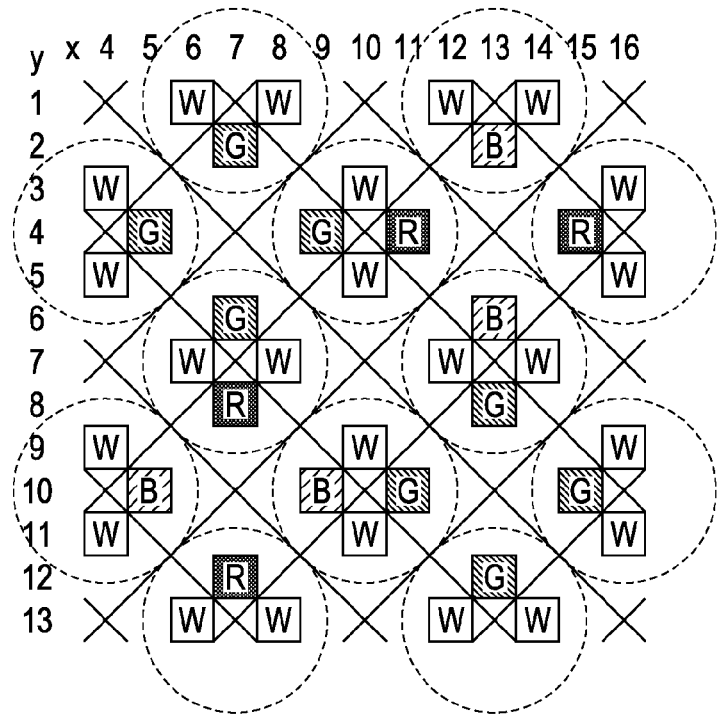
FIG. 27 is a diagram illustrating a state in which optical centers are arranged in an x-y space in color coding according to the first modification.

FIG. 27 is a diagram illustrating a state in which optical centers are arranged in an x-y space in the color coding according to the first modification.

(Demosaic Processing)

Next, the demosaic processing of changing the checkered pattern array of the color coding according to the first modification to the square array will be described.

Figure 28:
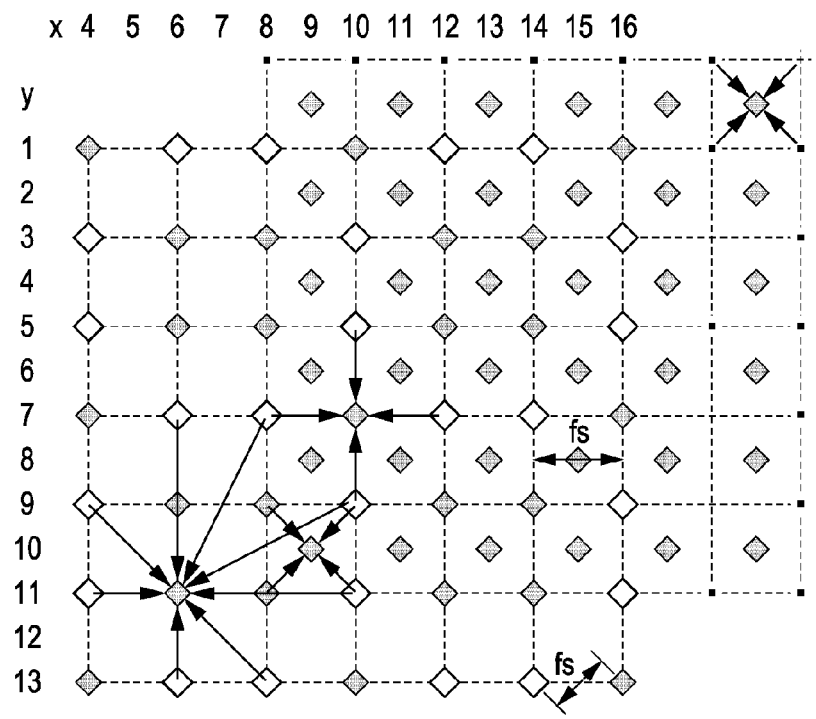
FIG. 28 is a diagram illustrating pixel shifting by developing information on W pixels to all pixels in the first modification.

In relation to W pixels, as illustrated in FIG. 28, after determining the directionality (correlation in the longitudinal direction, correlation in the transverse direction and correlation in the oblique direction) from information on pixels which actually exist (hereinafter, referred to as "actual pixels"), pixel information on a part having no actual pixels is generated based on information on actual pixels around the part, and is developed to all pixels. In FIG. 28, black diamonds indicate actual pixels of W and gray diamonds indicate pixels of W obtained through an operation.

As one example, the W pixels do not exist in a spatial position of (x=6, y=11). In order to obtain W information on the spatial position, information on eight W pixels (actual pixels) located around the spatial position is used. Further, the W pixels do not exist in a spatial position of (x=10, y=7). In order to obtain W information on the spatial position, information on four W pixels located around the spatial position is used.

Thereafter, information on a pixel located at the center of the four W pixels is obtained from information on the adjacent four W pixels through an operation. Processing of obtaining the information on the pixel located at the center of the four W pixels from the information on the four W pixels will be referred to as "pixel shifting". The centroid of the W pixel at the center of the four W pixels, which is obtained through the pixel shifting, coincides with the centroid of RGB color pixels.

Figure 29:
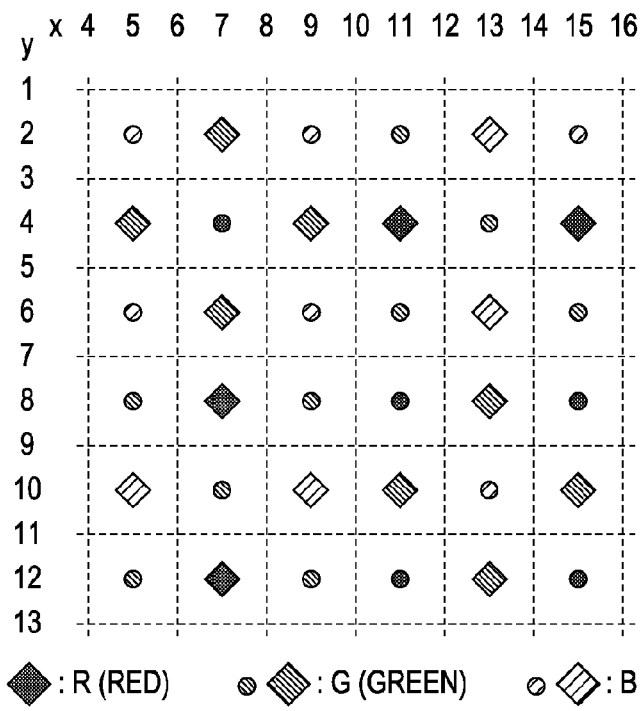
FIG. 29 is a diagram illustrating RGB interpolation processing based on a correlation of W-RGB with respect to RGB pixels in the first modification.

In relation to RGB pixels, as illustrated in FIG. 29, pixel information is obtained from a correlation of W-RGB through existing interpolation processing. In FIG. 29, diamonds indicate information on actual pixels of RGB, and small circles indicate information on pixels obtained through the interpolation processing (hereinafter, referred to as "interpolated pixels"). As a result of the above-described pixel shifting, the centroid of the W pixel coincides with the centroid of the RGB color pixels, so that a color correlation of the W pixel and the RGB color pixels can be obtained.

Figure 30:
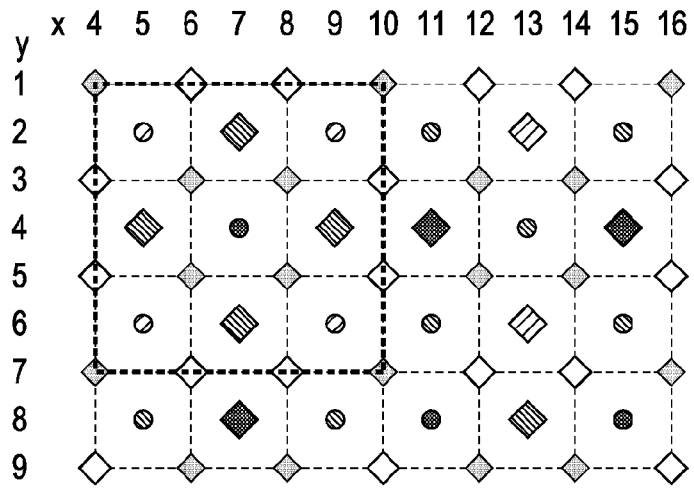
FIG. 30 is a diagram illustrating the synthesis of information on W pixels with information on RGB pixels in the first modification.

For example, a color correlation of the W pixel and the R pixel is obtained, so that information on the R pixel in an empty part, in which an R pixel does not exist, can be obtained from a correlation coefficient thereof. That is, the information on the W pixel obtained through the pixel shifting is used for obtaining color information on an empty part in which color pixels do not exist, what is called, compensating for color information. Through such processing, color information is reproduced. Then, as illustrated in FIG. 30, the information on the W pixel is synthesized with the information on the RGB pixels.

As described above, the information on the W pixel is developed to all pixels, the pixel shifting, which represents a conversion to the W pixel in the spatial middle position, is performed, and a correlation of the W pixel in the spatial middle position and the RGB pixels is obtained, so that the color filter array of the color coding according to the first modification can be restored to a Bayer array.

Then, signal processing using a spatial band low pass filter is performed with respect to signals of the Bayer array, so that the number of standard recording pixels when independently reading from the image memory 32 is 1.125 (=9/8) times the number of pixels (the number of actual pixels) of the original color filter array. However, an increase in the capacity of the image memory 32 necessary at this time is insignificant. Further, the information at the center of the four W pixels is generated from the information on the adjacent four W pixels through the pixel shifting, so that the number of pixels is 4.5 (=36/8) times as many as that in the original color filter array. That is, a data amount is four times (=4.5/1.125) as much as that when the number of standard recording pixels is applied.

Figure 31:
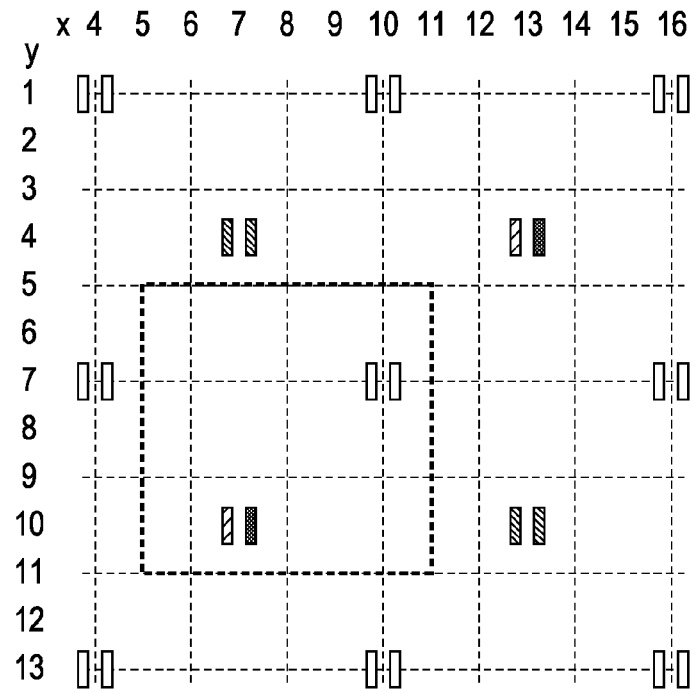
FIG. 31 is a diagram illustrating the configuration in which signals of WR four pixels are added and RB two pixels are added in the first modification.

After the information on the W pixel is synthesized with the information on the RGB pixels, as illustrated in FIG. 31, addition processing (four-pixel addition) among adjacent four pixels is performed with respect to W/G. As one example, in relation to a spatial position of (x=7, y=4), in FIG. 30, the four-pixel addition is performed with respect to information on a G pixel of (x=7, y=2), a G pixel of (x=7, y=6), a G pixel of (x=5, y=4) and a G pixel of (x=9, y=4). Meanwhile, addition processing (two-pixel addition) between upper/lower or right/left two pixels is performed with respect to R/B color information.

In the above description, the four-pixel addition is performed with respect to W/G and the two-pixel addition is performed with respect to R/B. However, the invention is not limited to the above addition methods. For example, after the demosaic processing is performed with respect to all the WGRB by using vertical two-pixel addition and horizontal two-pixel addition, resultants of the vertical two-pixel addition and horizontal two-pixel addition are added. As a result, the effects of the four-pixel addition can be obtained with respect to all the WGRB.

Figure 32:
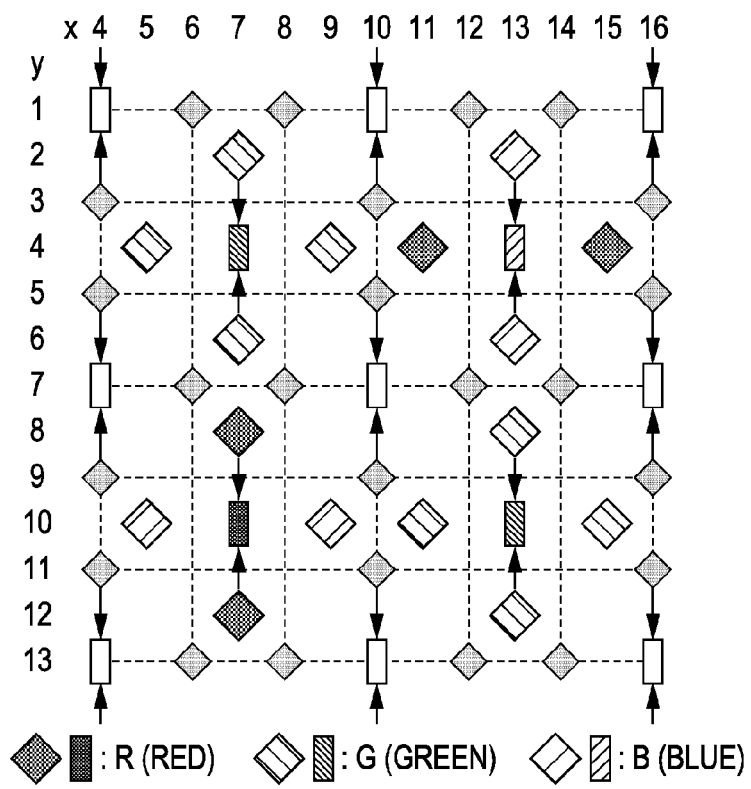
FIG. 32 illustrates a vertical addition plane in the first modification.
Figure 33:
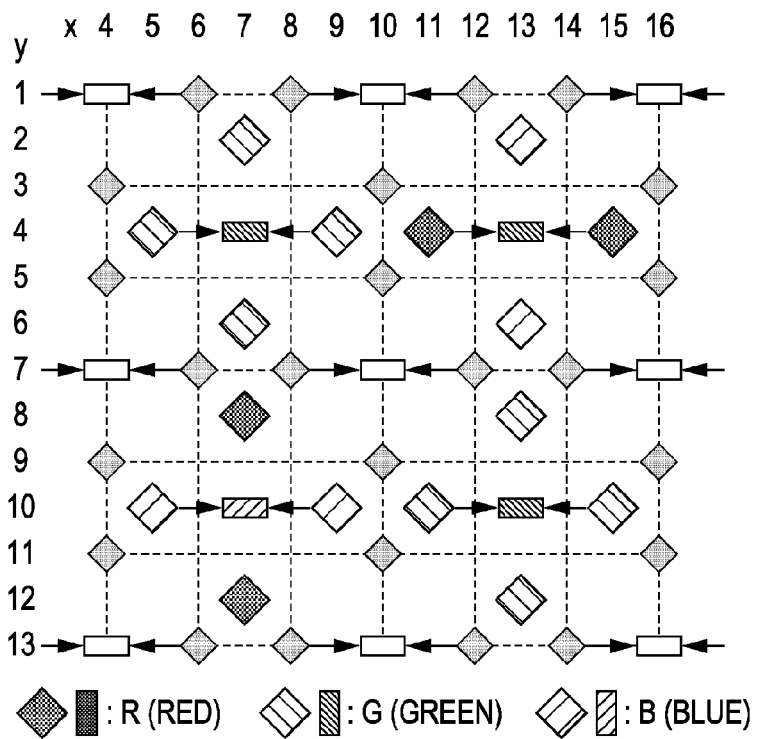
FIG. 33 illustrates a horizontal addition plane in the first modification.

FIG. 32 illustrates a vertical (upper/lower) addition plane and FIG. 33 illustrates a horizontal (right/left) addition plane. The vertical addition plane and the horizontal addition plane are added. As a result, the four-pixel addition is performed with respect to all the WGRB, so that the number of effective pixels is 0.25 (=2/8) and the number of recorded pixels is 0.5 (=4/8).

[Second Modification]
(Color Coding)

Figure 34:
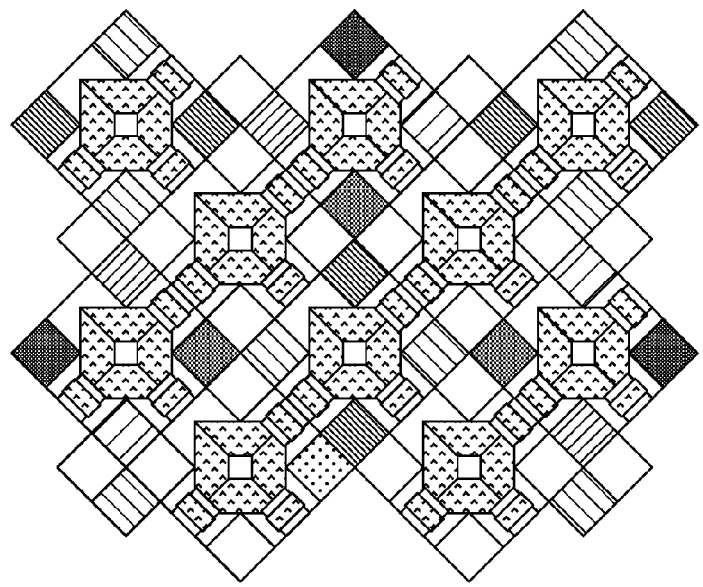
FIG. 34 is a diagram illustrating color coding according to a second modification.

FIG. 34 is a diagram illustrating color coding according to the second modification. The color coding according to the second modification is based on color coding according to the first modification, that is, the color coding in which all four pixels have the same color with respect to W/G filters, and a combination of two R pixels and two B pixels is applied to R/B filters.

In the color coding according to the second modification, first, in relation to four pixels of G filters, the sensitivity of vertical two pixels is low as compared with horizontal two pixels. That is, when comparing the sensitivity of vertical pixels to that of horizontal pixels, the sensitivity of horizontal two pixels is high and the sensitivity of vertical two pixels is low. In the case of W filters, similarly to the G filters, the sensitivity of horizontal two pixels is high and the sensitivity of vertical two pixels is low.

Meanwhile, in relation to four pixels including the combination of two R pixels and two B pixels, as compared with upper and left pixels of upper/lower and right/left four pixels, the sensitivity of lower and right pixels is low. Specifically, in four pixels in which upper/lower two pixels are R and right/left two pixels are B, when comparing those pixels, the sensitivity of the upper R pixel is high, the sensitivity of the lower R pixel is low, the sensitivity of the left B pixel is high, and the sensitivity of the right B pixel is low. Further, in four pixels in which upper/lower two pixels are B and right/left two pixels are R, when comparing those pixels, the sensitivity of the upper B pixel is high, the sensitivity of the lower B pixel is low, the sensitivity of the left R pixel is high, and the sensitivity of the right R pixel is low.

Figure 35:
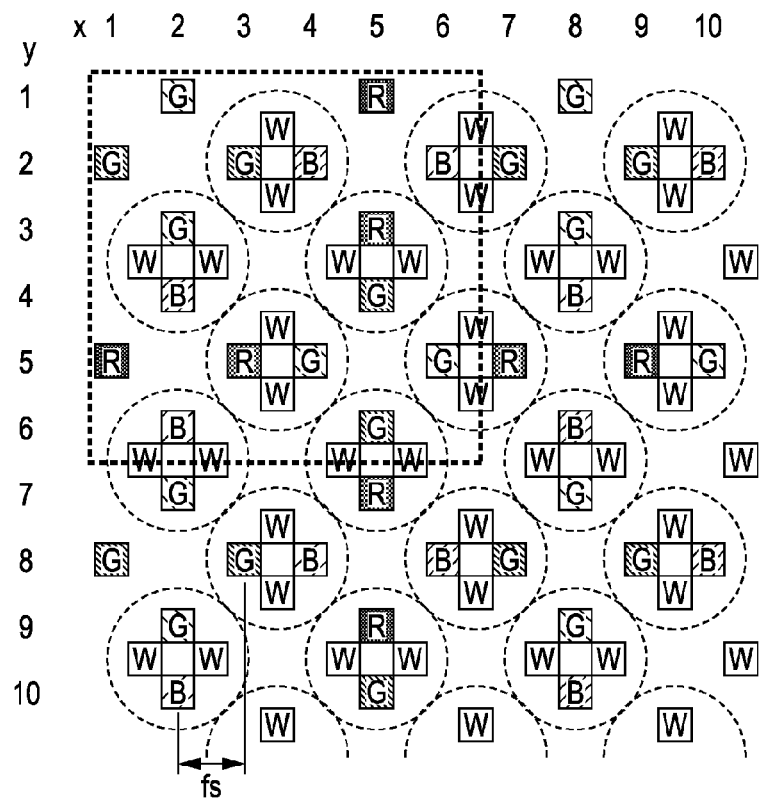
FIG. 35 is a diagram illustrating a state in which optical centers are arranged in an x-y space in color coding according to the second modification.

In relation to the micro lens array 34, similarly to the first to third embodiments, one micro lens is shared in units of four pixels such that colors different from each other are covered. FIG. 35 is a diagram illustrating a state in which optical centers are arranged in an x-y space in the color coding according to the second modification.

(Demosaic Processing)

Next, the demosaic processing of changing the checkered pattern array of the color coding according to the second modification to the square array will be described.

Figure 36:
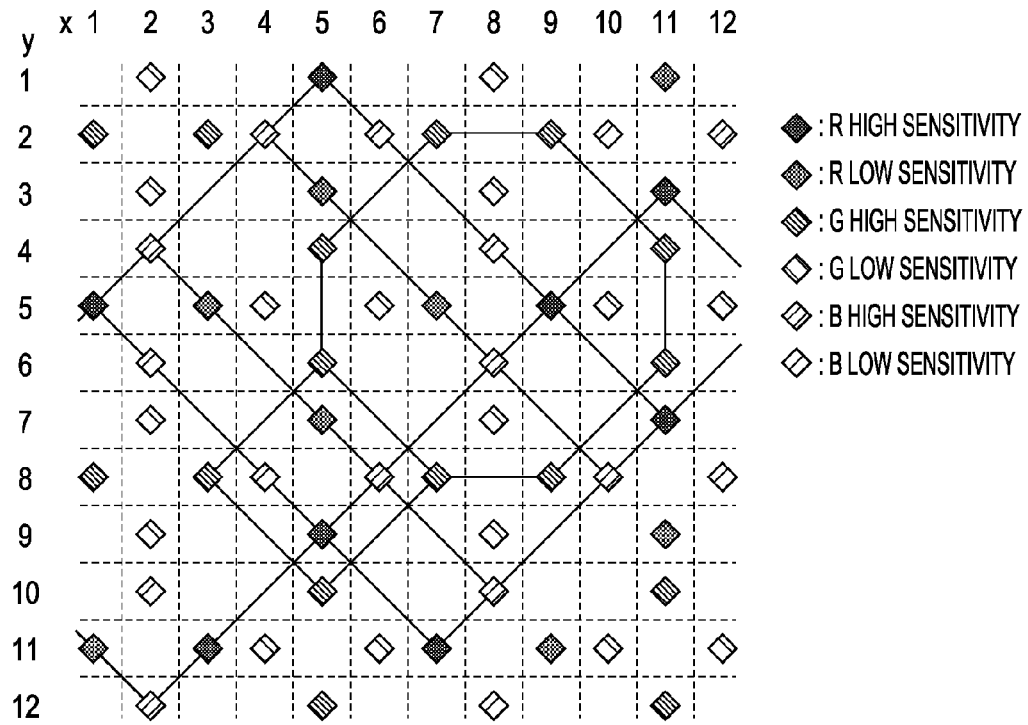
FIG. 36 is a diagram illustrating an array of information on actual pixels of RGB as a first plane.

First, information on actual pixels is extracted and arranged with respect to each pixel of RGB. FIG. 36 is a diagram illustrating an array of information on actual pixels of RGB as a first plane. Next, in relation to actual pixels of W, similarly to the case of the W pixels according to the first modification, after directionality is determined from the information on actual pixels, pixel information on a part, in which actual pixels do not exist, is generated based on information on surrounding actual pixels and developed to all pixels.

Figure 37:
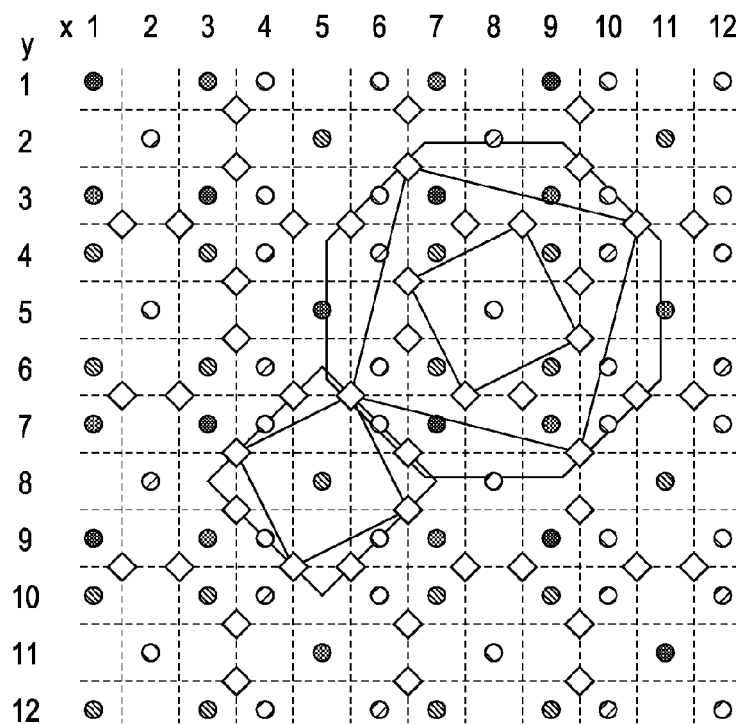
FIG. 37 is a diagram illustrating a pixel shifting array with respect to actual pixels of W as a W plane.

Further, the above-described pixel shifting processing is performed, so that information on a pixel located at the center of four W pixels is obtained from information on the adjacent four W pixels through an operation. FIG. 37 is a diagram illustrating a pixel shifting array with respect to actual pixels of W as a W plane.

Figure 38:
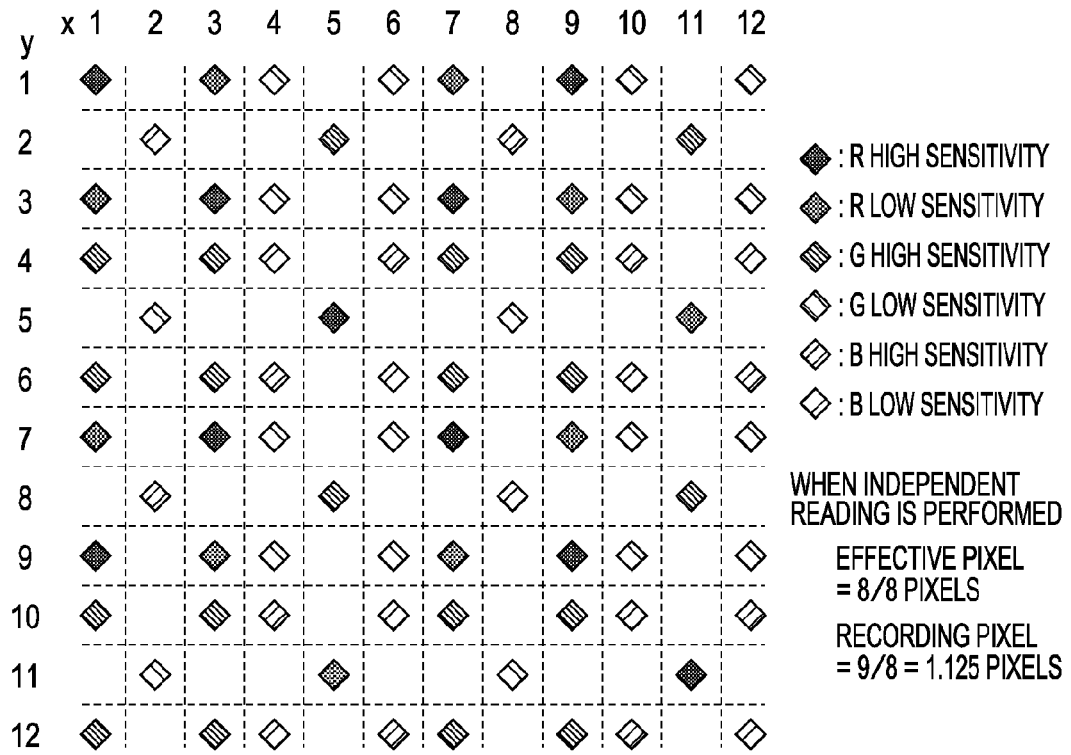
FIG. 38 is a diagram illustrating an array of information on interpolated pixels of RGB as a second plane.

In relation to RGB pixels, similarly to the case of the RGB pixels according to the first modification, pixel information (information on interpolated pixels) is obtained from a correlation of W-RGB through existing interpolation processing. FIG. 38 is a diagram illustrating an array of information on interpolated pixels of RGB as a second plane. In FIG. 38, diamonds indicate the information on the interpolated pixels of RGB.

Figure 39:
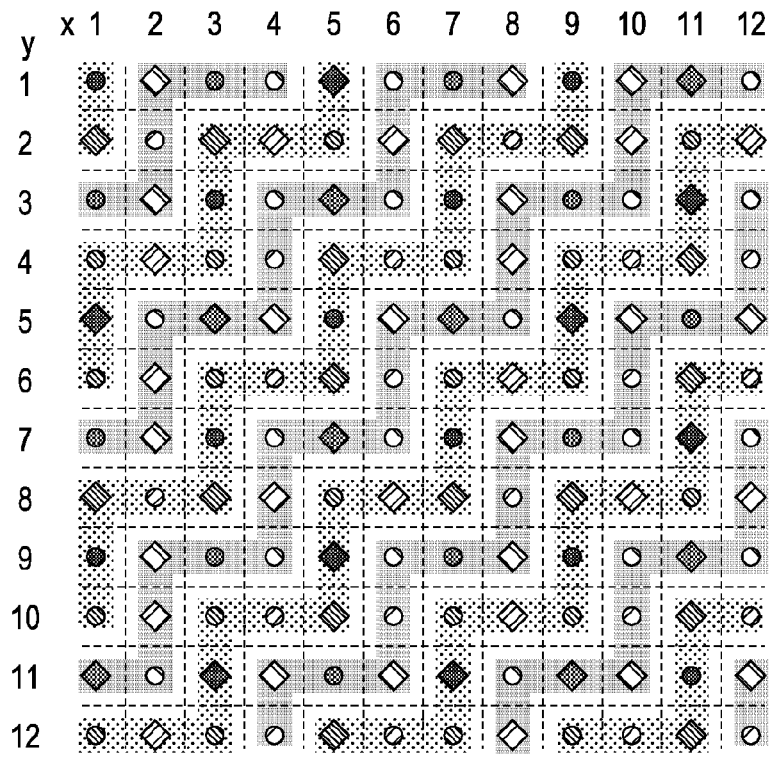
FIG. 39 is a diagram illustrating a Bayer array restored by adding the first plane to the second plane.

Then, the first plane of FIG. 36 and the second plane of FIG. 38 are added, so that the color filter array of the color coding according to second modification can be restored to the Bayer array as illustrated in FIG. 39. During the addition, the number of effective pixels is 5/16 and the number of recorded pixels is 0.5 (=4/8).

The technology called SVE (Spatially Varying Exposure) scheme (for example, refer to WO 02/056603) can be applied to signals of each pixel in the color filter array illustrated in FIG. 39. The SVE scheme is a technology capable of improving a dynamic range using a spatial sensitivity pattern without reducing resolution.

According to the SVE scheme, each pixel has only one type of sensitivity. Thus, each pixel of a captured image has only information on a dynamic range, which is included in the original image capturing element. On the other hand, predetermined image processing is performed with respect to an obtained image signal so that sensitivity of all pixels is uniform, so that an image having a wide dynamic range can be finally generated.

Figure 40:
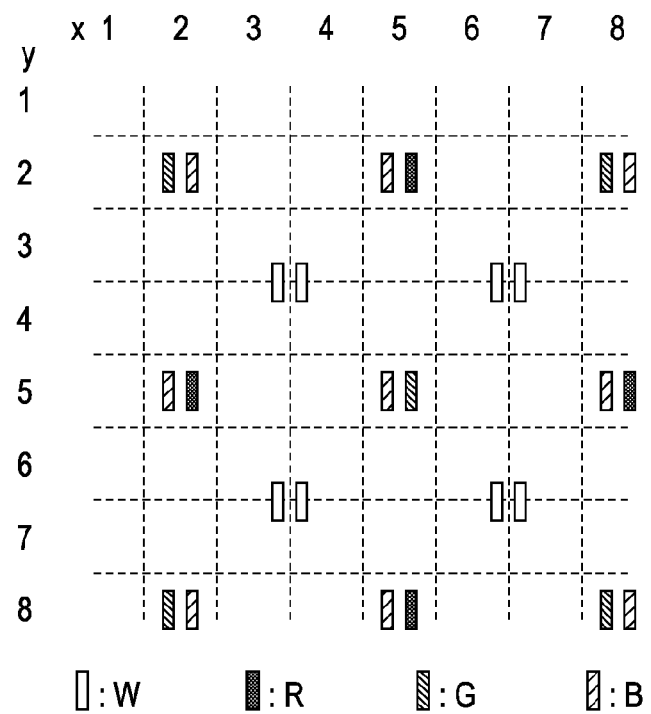
FIG. 40 is a diagram illustrating a resultant obtained by adding a vertical addition plane to a horizontal addition plane as an addition plane.

In the second modification, similarly to the first modification, it is possible to employ a scheme of generating a vertical addition plane and a horizontal addition plane through vertical two-pixel addition and horizontal two-pixel addition, and adding these planes. FIG. 40 is a diagram illustrating a resultant obtained by adding the vertical addition plane to the horizontal addition plane as an addition plane.

[Third Modification]
(Color Coding)

Figure 41:
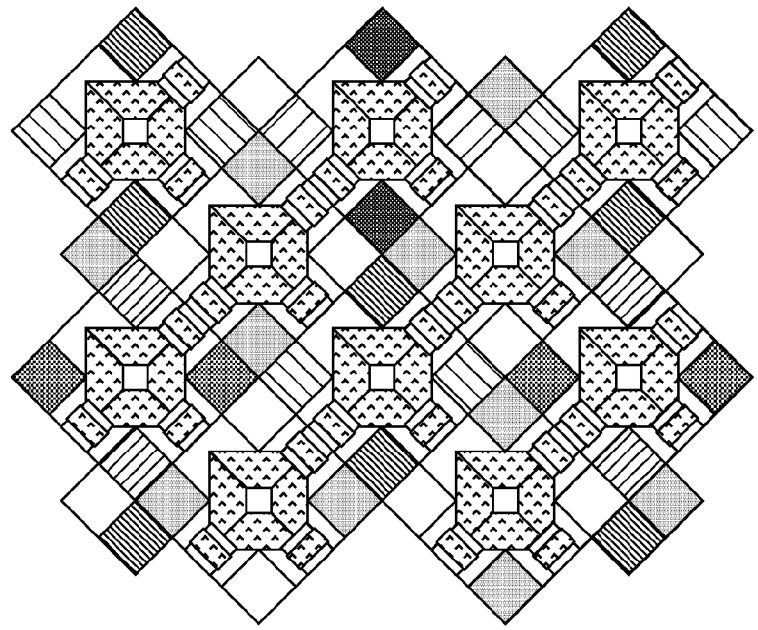
FIG. 41 is a diagram illustrating color coding according to a third modification.

FIG. 41 is a diagram illustrating color coding according to the third modification. The color coding according to the third modification is based on color coding in which a combination of variation of sensitivity of each pixel is different from that of the color coding according to the second modification.

Specifically, in the color coding according to the third modification, in relation to four pixels of G filters, the sensitivity of vertical two pixels is high as compared with horizontal two pixels. That is, when comparing those pixels, the sensitivity of horizontal two pixels is low and the sensitivity of vertical two pixels is high. In the case of W filters, similarly to the G filters, the sensitivity of horizontal two pixels is low and the sensitivity of vertical two pixels is high.

Meanwhile, in relation to four pixels including the combination of two R pixels and two B pixels, as compared with horizontal two pixels, the sensitivity of vertical two pixels is high. That is, in the combination in which vertical two pixels are R and horizontal two pixels are B, the sensitivity of the two R pixels is high as compared with the two B pixels. Further, in the combination in which vertical two pixels are B and horizontal two pixels are R, the sensitivity of the two B pixels is high as compared with the two R pixels.

Figure 42:
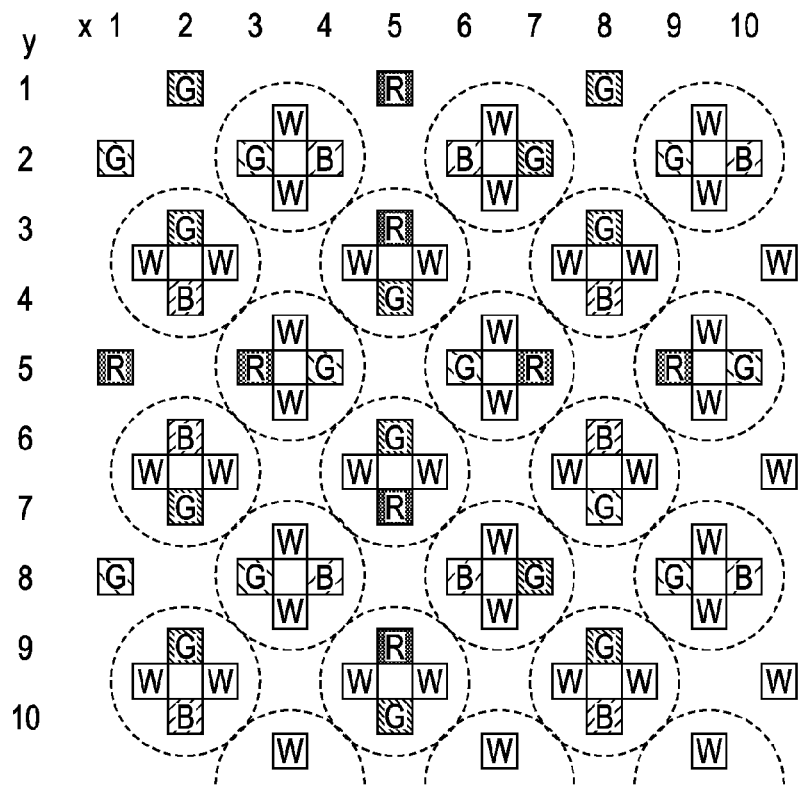
FIG. 42 is a diagram illustrating a state in which optical centers are arranged in an x-y space in color coding according to the third modification.

In relation to the micro lens array 34, similarly to the first to third embodiments, one micro lens is shared in units of four pixels such that colors different from each other are covered. FIG. 42 is a diagram illustrating a state in which optical centers are arranged in an x-y space in the color coding according to the third modification.

(Demosaic Processing)

Next, the demosaic processing of changing the checkered pattern array of the color coding according to the third modification to the square array will be described. The same demosaic processing is performed in the third modification, except for the difference in the combination of variation of sensitivity of each pixel according to the second modification.

Figure 43:
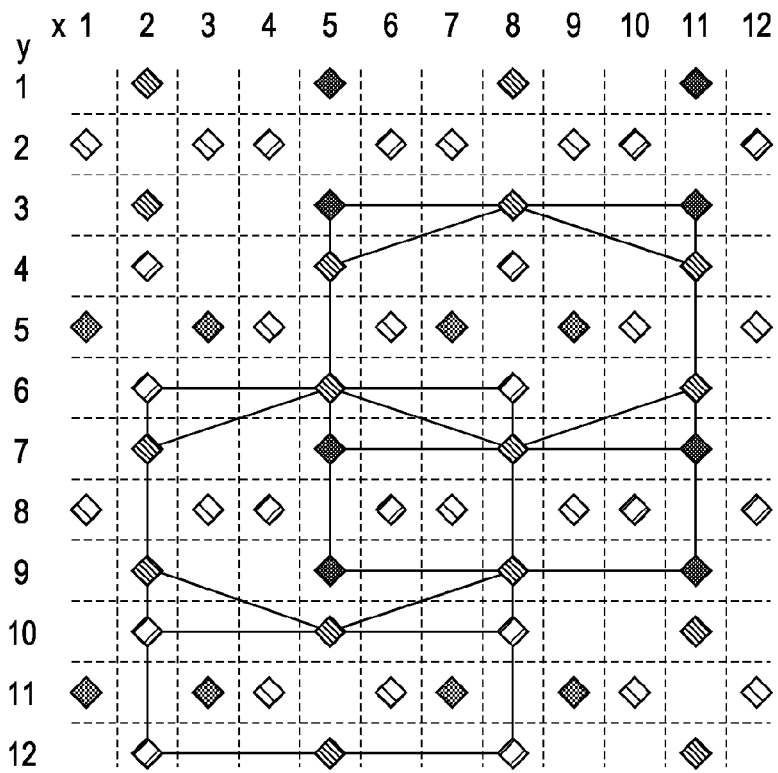
FIG. 43 is a diagram illustrating an array of information on actual pixels of RGB as a first plane.

First, information on actual pixels is extracted and arranged with respect to each pixel of RGB. FIG. 43 is a diagram illustrating an array of information on actual pixels of RGB as a first plane. Next, in relation to actual pixels of W, similarly to the case of the W pixels according to the first modification, after directionality is determined from the information on actual pixels, pixel information on a part, in which actual pixels do not exist, is generated based on information on surrounding actual pixels and developed to all pixels.

Figure 44:
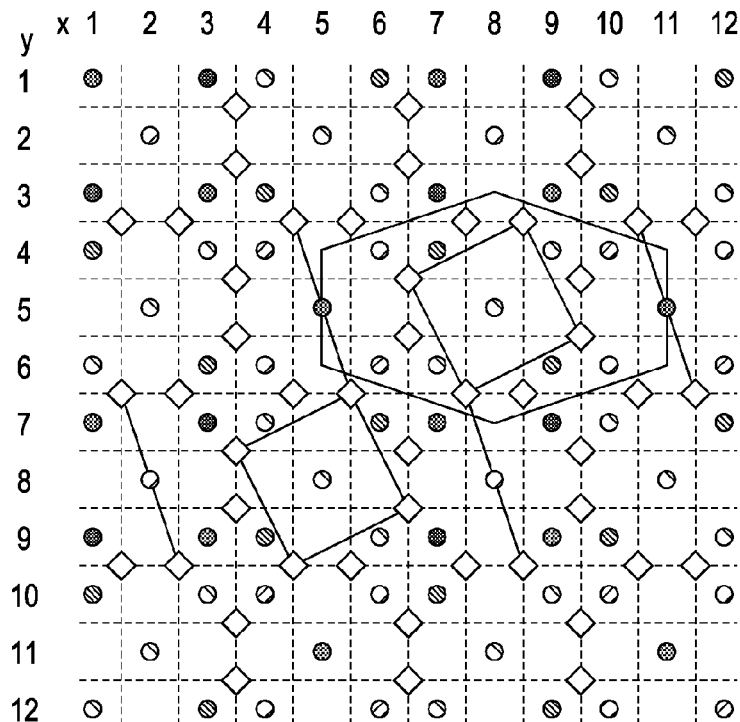
FIG. 44 is a diagram illustrating a pixel shifting array with respect to actual pixels of W as a W plane.

Further, the above-described pixel shifting processing is performed, so that information on a pixel located at the center of four W pixels is obtained from information on the adjacent four W pixels through an operation. FIG. 44 is a diagram illustrating a pixel shifting array with respect to actual pixels of W as a W plane.

Figure 45:
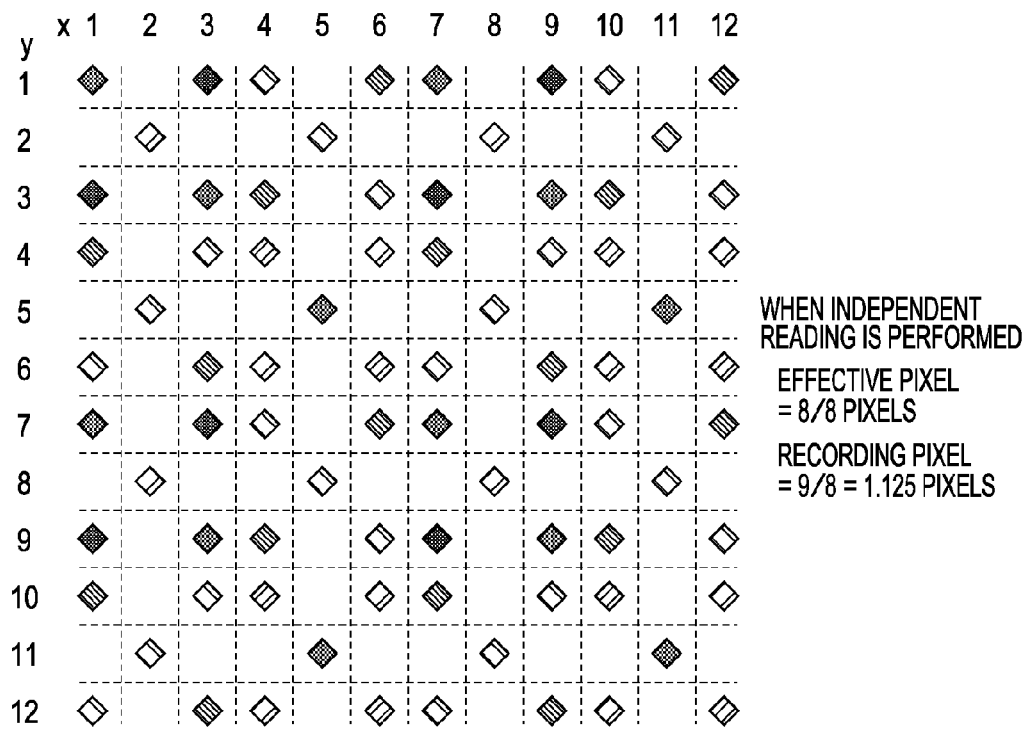
FIG. 45 is a diagram illustrating an array of information on interpolated pixels of RGB as a second plane.

In relation to RGB pixels, similarly to the case of the RGB pixels according to the first modification, pixel information (information on interpolated pixels) is obtained from a correlation of W-RGB through existing interpolation processing. FIG. 45 is a diagram illustrating an array of information on interpolated pixels of RGB as a second plane. In FIG. 45, diamonds indicate the information on the interpolated pixels of RGB.

Figure 46:
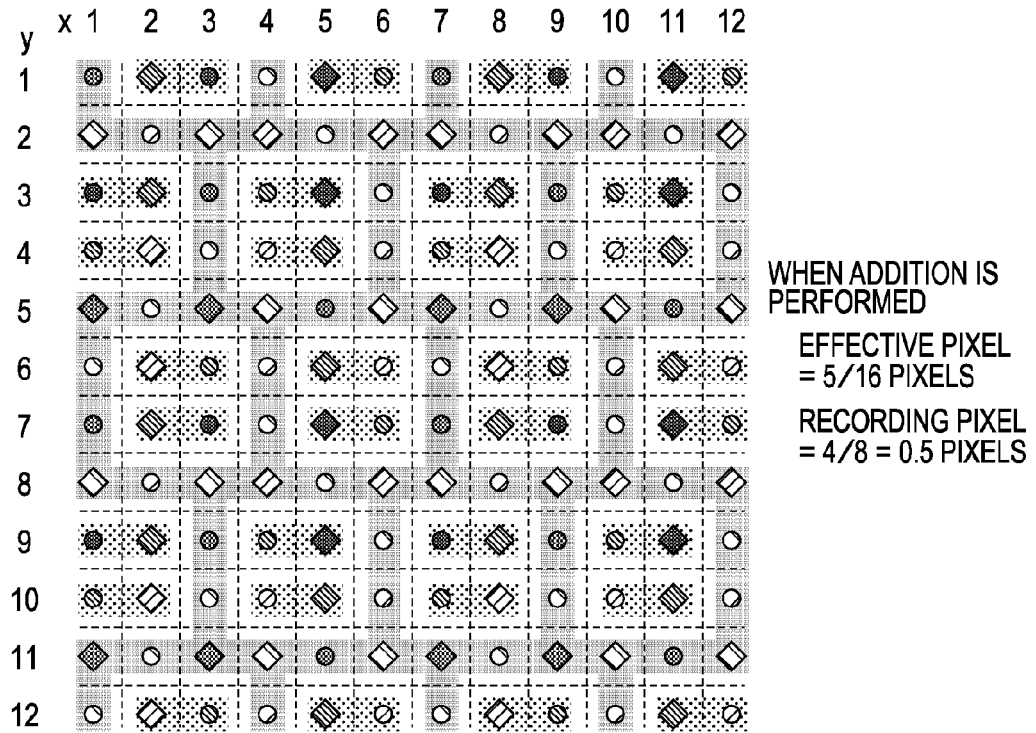
FIG. 46 is a diagram illustrating a Bayer array restored by adding a first plane to a second plane.

Then, the first plane of FIG. 43 and the second plane of FIG. 45 are added, so that the color filter array of the color coding according to second modification can be restored to the Bayer array as illustrated in FIG. 46. During the addition, the number of effective pixels is 5/16 and the number of recorded pixels is 0.5 (=4/8).

Figure 47:
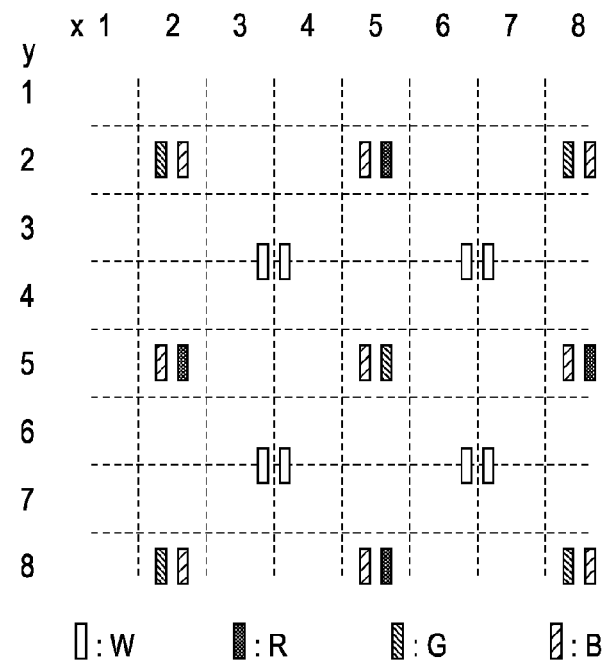
FIG. 47 is a diagram illustrating a resultant obtained by adding a vertical addition plane to a horizontal addition plane as an addition plane.

In the third modification, similarly to the first modification, it is possible to employ a scheme of generating a vertical addition plane and a horizontal addition plane through vertical two-pixel addition and horizontal two-pixel addition, and adding these planes. FIG. 47 is a diagram illustrating a resultant obtained by adding the vertical addition plane to the horizontal addition plane as an addition plane.

<7. Application>

[Image Capturing Apparatus]

Figure 48:
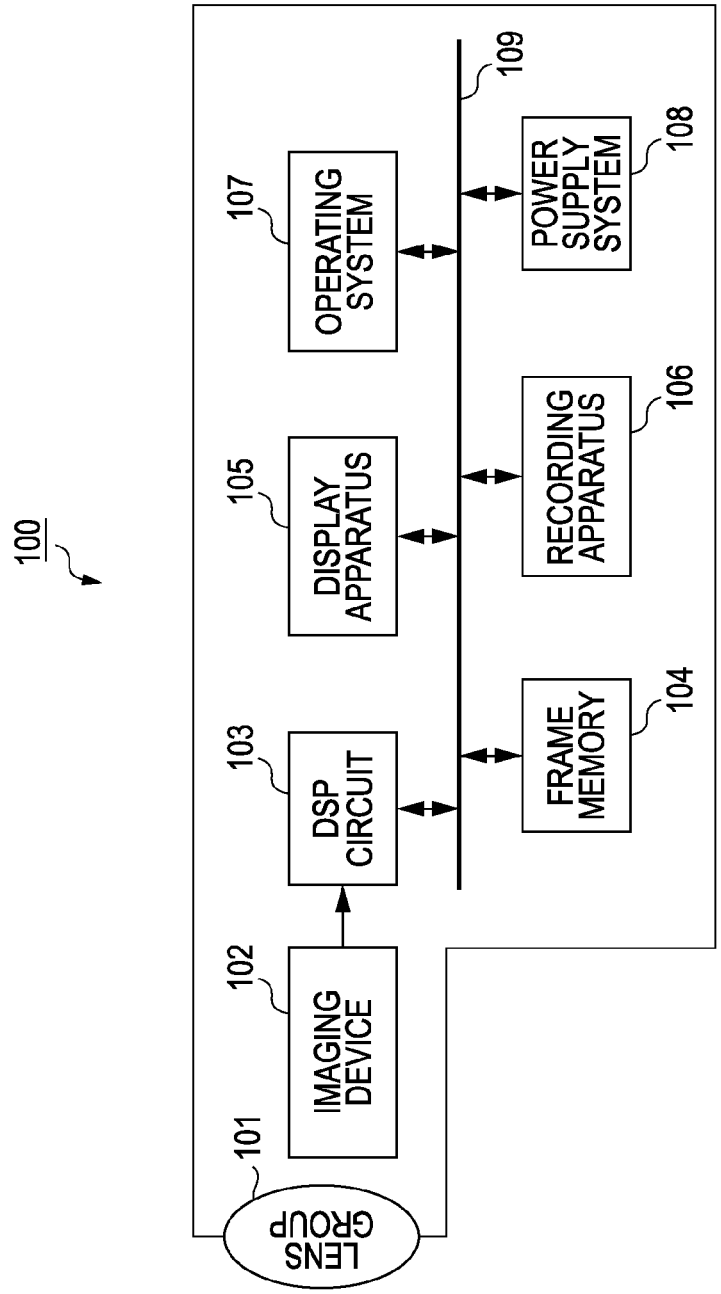
FIG. 48 is a block diagram illustrating one example of the configuration of an image capturing apparatus according to the invention.

FIG. 48 is a block diagram illustrating one example of the configuration of an image capturing apparatus according to the invention.

As shown in FIG. 48, the image capturing apparatus 100 according to the invention includes an optical system including a lens group 101 such as an image capturing lens, an imaging device 102, a DSP circuit 103 serving as a camera signal processing circuit, a frame memory 104, a display device 105, a recording device 106, an operating system 107, a power supply system 108 and the like. The DSP circuit 103, the frame memory 104, the display device 105, the recording device 106, the operating system 107 and the power supply system 108 are connected to each other through a bus line 109.

The lens group 101 captures incident light (image light) from an object and allows an image to be formed on an image capturing surface of the imaging device 102. The imaging device 102 converts the amount of the incident light, which is formed on the image capturing surface as the image by the lens group 101, into an electric signal in units of pixels, and outputs the electric signal as a pixel signal. As the imaging device 102, the above-described CMOS image sensor 10, to which the invention is applied, is used. As the color filter array 33, the CMOS image sensor 10 includes the color filter arrays of the color coding according to the first and third embodiments, or the color filter arrays of the color coding according to the first and third modifications.

The DSP circuit 103 corresponds to the DSP circuit 31 of FIG. 1 and temporarily stores image data corresponding to one frame, which is output from the sensor chip 11, in the frame memory 104 corresponding to the image memory 32. Further, the DSP circuit 103 performs various types of signal processing including the above-described demosaic processing using the image data stored and held in the frame memory 104.

The display device 105 includes a panel type display device, such as a liquid crystal display device or an organic EL (Electro Luminescence) display device, and displays a moving image or a still image captured by the imaging device 102. The recording device 106 records the moving image or the still image, which has been captured by the imaging device 102, on a recording medium such as a video tape or a DVD (Digital Versatile Disk).

The operating system 107 issues operation orders with respect to various functions of the image capturing apparatus under the operation of a user. The power supply system 108 supplies various types of power to the DSP circuit 103, the frame memory 104, the display device 105, the recording device 106 and the operating system 107 as operating power.

The image capturing apparatus 100 is applied to a video camera or a digital still camera, and, further, to a camera module used for mobile equipment such as a portable phone. Further, the CMOS image sensor, which includes the color filter array 33 of the color coding according to the first and third embodiments or the color coding according to the first and third modifications, is used as the imaging device 102, so that the following effects can be obtained.

That is, the checkered pattern array obtained by rotating the RGB Bayer array by 45° is employed, and the color filter array 33 of the color coding, in which the four pixels adjacent to each other in the upper/lower and right/left directions have the same color, is used, so that the capacity of the frame memory 104 can be prevented from being unnecessarily increased. Thus, the capacity of the frame memory 104 necessary for the demosaic processing in the DSP circuit 103 can be reduced, so that the cost for the entire system of the image capturing apparatus can be reduced.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels; and
a color array filter with filters over the plurality of pixels, the color array filter having a spatial sampling point (x, y) that is approximately arranged such that at least one of (x=3*(2n−1+oe)+1±2 and y=3m−2) and (x=3*(2n−1+oe)+1 and y =3m−2±2) is satisfied in which n and m are integers, oe has a value of 0 when m is an odd number and a value of 1 when n is an even number.

2. The solid-state imaging device of claim 1, wherein:
the filters of the color filter array are color coded such that two adjacent pixels in one of a upper/lower and right/left directions are the same color.

3. The solid-state imaging device of claim 1, wherein the filters of the color filter array comprise a checkered pattern array rotated by 45°.

4. The solid-state imaging device of claim 1, wherein:
the filters of the color filter array are arranged such that four adjacent pixels that form a square shape are provided with a same color filter.

5. The solid-state imaging device of claim 1, further comprising:
a micro lens array with micro lenses, each micro lens covering a set of adjacent pixels with different color filters.

6. The solid-state imaging device of claim 5, wherein:
the set of adjacent pixels with different color filters includes at least a pixel with a red color filter, a pixel with a blue color filter, and a pixel with one of a green color filter or a white filter.

7. The solid-state imaging device of claim 1, wherein:
a set of adjacent pixels includes two adjacent pixels with different sensitivities.

8. An imaging apparatus comprising:
a solid-state imaging device including (a) a plurality of pixels, and (b) a color array filter with filters over the plurality of pixels, the color array filter having a spatial sampling point (x, y) that is approximately arranged such that at least one of (x=3*(2n−1+oe)+1±2 and y=3m−2) and (x=3*(2n−1+oe)+1 and y=3m−2±2) is satisfied in which n and m are integers, and oe has a value of 0 when m is an odd number and a value 1 when n is an even number.

9. A signal processing method of a solid-state imaging device including (a) a plurality of pixels, and (b) a color array filter with filters over the plurality of pixels, the color array filter having a spatial sampling point (x, y) that is approximately arranged such that at least one of (x=3*(2n−1+oe) +1±2 and y=3m−2) and (x=3*(2n−1+oe)+1 and y=3m−2±2) is satisfied in which n and m are integers, oe has a value of 0 when m is an odd number and a value of 1 when n is an even number, said method comprising:
generating pixel information of a first pixel based on pixel information of adjacent pixels having a first color filter;
generating pixel information of a second pixel based on pixel information of adjacent pixels having a second color filter; and
synthesizing the pixel information of the first pixel with the pixel information of the second pixel.

10. The signal processing method of claim 9, wherein the pixel information of adjacent pixels having a first color filter is obtained through interpolation processing.

* * * * *